United States Patent
Inoue

(10) Patent No.: US 12,080,729 B2
(45) Date of Patent: Sep. 3, 2024

(54) PHOTODETECTOR

(71) Applicant: Panasonic Intellectual Property Management Co., Ltd., Osaka (JP)

(72) Inventor: Akito Inoue, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 410 days.

(21) Appl. No.: 17/479,847

(22) Filed: Sep. 20, 2021

(65) Prior Publication Data

US 2022/0005854 A1 Jan. 6, 2022

Related U.S. Application Data

(63) Continuation of application No. PCT/JP2020/011661, filed on Mar. 17, 2020.

(30) Foreign Application Priority Data

Mar. 28, 2019 (JP) .................. 2019-064524

(51) Int. Cl.
*H01L 27/146* (2006.01)

(52) U.S. Cl.
CPC .... *H01L 27/14605* (2013.01); *H01L 27/1461* (2013.01); *H01L 27/14623* (2013.01);
(Continued)

(58) Field of Classification Search
CPC .......... H01L 27/14605; H01L 27/1461; H01L 27/14623; H01L 27/14643;
(Continued)

(56) References Cited

U.S. PATENT DOCUMENTS

| 5,548,112 A * | 8/1996 | Nakase | ................ H01L 31/107 |
| | | | 250/214 R |
| 2008/0308738 A1* | 12/2008 | Li | ................ G01T 1/20182 |
| | | | 250/370.11 |

(Continued)

FOREIGN PATENT DOCUMENTS

| JP | H07-176782 A | 7/1995 |
| JP | 2011-204879 A | 10/2011 |

(Continued)

OTHER PUBLICATIONS

Lin WS, Sung GM, Lin JL. High Performance CMOS Light Detector with Dark Current Suppression in Variable-Temperature Systems. Sensors (Basel). Dec. 23, 2016;17(1):15. doi: 10.3390/s17010015. PMID: 28025530; PMCID: PMC5298588 (Year: 2016).*

(Continued)

*Primary Examiner* — Sitaramarao S Yechuri
(74) *Attorney, Agent, or Firm* — Rimon P.C.

(57) ABSTRACT

A photodetector includes a first APD that is sensitive to incident light and a second APD through which a constant current flows regardless of the incident light. One terminal of the first APD is electrically connected to one terminal of the second APD, another terminal of the first APD and another terminal of the second APD are connected to different power supplies, respectively, and the one terminal of the first APD and the one terminal of the second APD are both anodes or cathodes.

20 Claims, 40 Drawing Sheets

(52) U.S. Cl.
CPC .................. *H01L 27/14643* (2013.01); *H01L 27/14685* (2013.01); *H01L 27/14689* (2013.01)

(58) Field of Classification Search
CPC ......... H01L 27/14685; H01L 27/14689; H01L 27/14607; H01L 31/10; H01L 31/107; G01J 1/42; G01J 1/44
See application file for complete search history.

(56) References Cited

U.S. PATENT DOCUMENTS

| | | | |
|---|---|---|---|
| 2009/0256223 A1 | 10/2009 | Yamamura et al. | |
| 2011/0057267 A1* | 3/2011 | Chuang ............. | H01L 29/66545 257/E29.325 |
| 2012/0248295 A1 | 10/2012 | Ito et al. | |
| 2014/0374867 A1 | 12/2014 | De Munck et al. | |
| 2015/0281620 A1 | 10/2015 | Usuda et al. | |
| 2018/0266881 A1* | 9/2018 | Fujiwara ............. | H01L 27/1443 |
| 2021/0050461 A1* | 2/2021 | Park .................... | H01L 31/0232 |

FOREIGN PATENT DOCUMENTS

| | | |
|---|---|---|
| JP | 2015-005752 A | 1/2015 |
| JP | 2018-157032 A | 10/2018 |
| WO | 2008/004547 A1 | 1/2008 |
| WO | 2014/097519 A1 | 6/2014 |

OTHER PUBLICATIONS

Japanese Office Action dated Jul. 12, 2022 issued in the corresponding Japanese Patent Application No. 2021-509117.
International Search Report and Written Opinion issued in International Patent Application No. PCT/JP2020/011661, dated Jun. 16, 2020; with partial English translation.

* cited by examiner

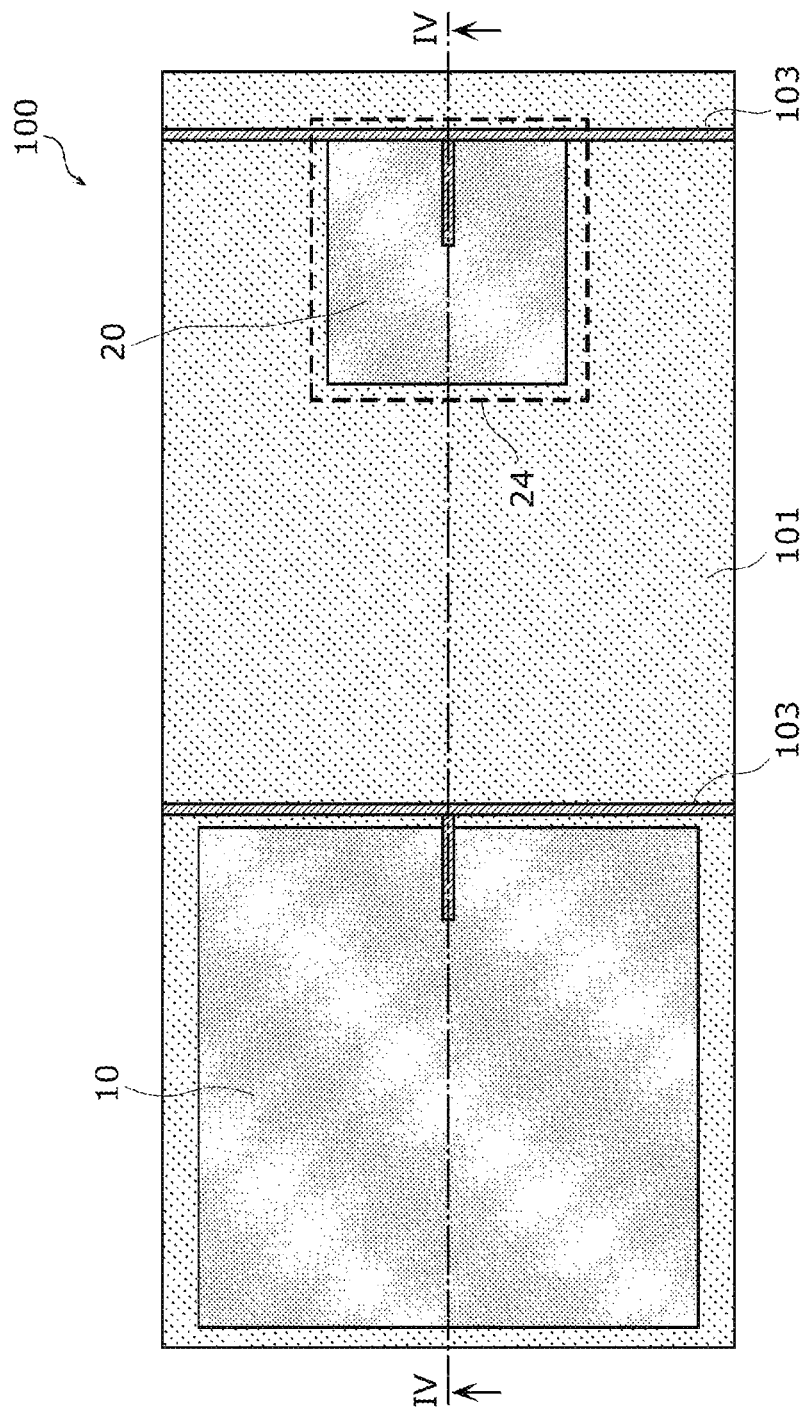

PHOTODETECTOR

CROSS REFERENCE TO RELATED APPLICATIONS

This is a continuation application of PCT International Application No. PCT/JP2020/011661 filed on Mar. 17, 2020, designating the United States of America, which is based on and claims priority of Japanese Patent Application No. 2019-064524 filed on Mar. 28, 2019. The entire disclosures of the above-identified applications, including the specifications, drawings and claims are incorporated herein by reference in their entirety.

FIELD

The present disclosure relates to a photodetector.

BACKGROUND

In recent years, high-sensitivity photodetectors have been used in a wide range of fields such as medical care, communications, biotechnology, chemistry, surveillance, in-vehicle use, and radiation detection. An avalanche photodiode (hereinafter, also referred to as APD) is used as one of the means for increasing the sensitivity. The APD is a photodiode in which the light detection sensitivity is enhanced by multiplying the signal charge generated by the photoelectric conversion of the light incident on the photoelectric conversion layer by using the avalanche breakdown. By using APD, even a small number of photons can be detected.

For example, a photon counting type photodetector using APD (see, for example, Patent Literature (PTL) 1) and a high-sensitivity image sensor (see, for example, PTL 2) have been devised.

In addition, for example, a reach-through type APD is disclosed as an example of the structure of the APD (see, for example, PTL 2 and PTL 3).

In order to use APD stably, it is necessary that the optical characteristics do not change in a wide temperature range from low temperature to high temperature. In particular, since the optical characteristics of the APD change depending on the magnitude of the reverse bias applied to the APD, a configuration is disclosed in which a circuit or element for measuring the temperature and feeding back to the applied voltage is provided (see PTL 4 and PTL 5).

CITATION LIST

Patent Literature

PTL 1: International Patent Publication No. 2008/004547
PTL 2: International Patent Publication No. 2014/097519
PTL 3: Japanese Unexamined Patent Application Publication No. 2015-5752
PTL 4: Japanese Unexamined Patent Application Publication No. 2011-204879
PTL 5: Japanese Unexamined Patent Application Publication No. H7-176782

SUMMARY

Technical Problem

The characteristics of APD (for example, multiplication ratio, photon detection probability, and the like) are temperature dependent. In a photodetector including an APD, it is an issue to reduce the temperature dependence of the characteristics of the APD.

The present disclosure provides a photodetector capable of reducing the temperature dependence of the APD characteristics.

Solution to Problem

The photodetector according to one aspect of the present disclosure includes: a first avalanche photodiode that is sensitive to incident light; and a second avalanche photodiode through which a current flows, the current having a smaller current value fluctuation width than a current flowing through the first avalanche photodiode, wherein one terminal of the first avalanche photodiode is electrically connected to one terminal of the second avalanche photodiode, another terminal of the first avalanche photodiode and another terminal of the second avalanche photodiode are connected to different power supplies, and the one terminal of the first avalanche photodiode and the one terminal of the second avalanche photodiode are both anodes or cathodes.

Advantageous Effects

The photodetector according to one aspect of the present disclosure can reduce the temperature dependence of the characteristics of the APD.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3 is a plan view of the photodetector according to Embodiment 1.

DESCRIPTION OF EMBODIMENTS

Figure 1:
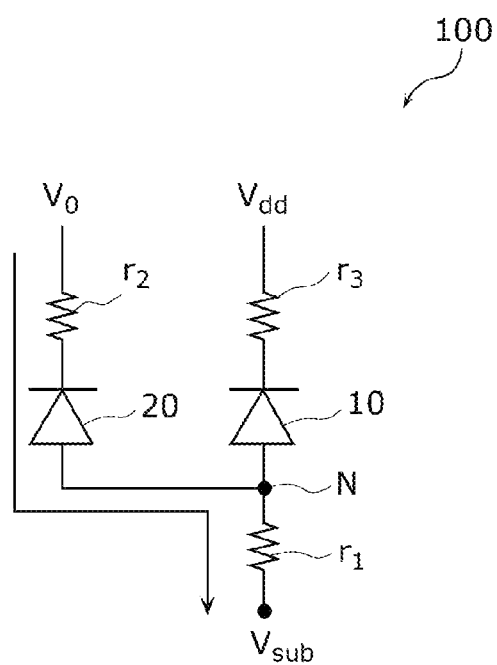
FIG. 1 is a diagram showing a circuit configuration of a photodetector according to Embodiment 1.

Hereinafter, embodiments will be described with reference to the drawings. It should be noted that all of the embodiments described below show preferred specific examples of the present disclosure. Therefore, the numerical values, components, arrangement positions and connection forms of the components, steps, order of the steps, and the like shown in the following embodiments are examples and are not intended to limit the present disclosure. Therefore, among the components in the following embodiments, the components not described in the independent claims are described as arbitrary components.

In addition, each figure is a schematic view and is not necessarily exactly illustrated. Therefore, the scales and the like do not always match in each figure. In each figure, substantially the same configuration is designated by the same reference numeral, and duplicate description may be omitted or simplified.

In addition, in the following embodiments, expressions using "substantially" such as in the substantially horizontal direction are used. For example, substantially the same means not only completely the same, but also substantially the same, and may include, for example, a difference of about several percent.

In addition, in the following embodiments, the terms "upper" and "lower" do not refer to the upward direction (vertically upward) and the downward direction (vertically downward) in absolute spatial recognition, but are used as the terms that define the relative positional relationship in the laminated structure. In the following embodiments, the front surface side of the semiconductor substrate is "upper" and the back surface side is "lower". In addition, the terms "upper" and "lower" are applied to not only the case where the two components are spaced apart from each other and another component exists between the two components, but also the case where the two components are placed in close contact with each other and touch each other.

In addition, "planar view" means that the semiconductor substrate is viewed from the normal direction of the main surface (for example, the back surface). The present disclosure does not exclude a structure in which the P-type and the N-type are reversed in the following embodiments.

Embodiment 1

[Circuit Configuration of Photodetector]

First, the structure of the photodetector according to Embodiment 1 will be described with reference to FIG. 1. FIG. 1 is a diagram showing a circuit configuration of the photodetector according to Embodiment 1.

As shown in FIG. 1, photodetector 100 includes first avalanche photodiode 10 (hereinafter, also referred to as first APD 10), second avalanche photodiode 20 (hereinafter, also referred to as second APD 20), first resistor r1, third resistor r3, and second resistor r2. It should be noted that in the following, the resistance value of first resistor r1 is described as R1, the resistance value of second resistor r2 is described as R2, and the resistance value of third resistor r3 is described as R3. The arrows in FIG. 1 indicate the direction in which a current having a negative polarity flows.

First APD 10 is an avalanche photodiode that is sensitive to the light incident on photodetector 100. That is, a current corresponding to the incident light flows through first APD 10. A first reverse bias is applied between the cathode and the anode of first APD 10. In FIG. 1, the first reverse bias is $V_{sub}-V_{dd}$. Third resistor r3 connected in series with first APD 10 transiently stops the multiplication in first APD 10 by functioning as a quenching element. That is, first APD 10 operates in the same manner as a general APD.

Second APD 20 is an avalanche photodiode that is not sensitive to the light incident on photodetector 100. That is, a substantially constant current flows through second APD 20 regardless of the incident light. In other words, a current having a smaller fluctuation width of the current value than first APD 10 flows through second APD 20. It is desirable that second APD 20 has substantially the same breakdown voltage as first APD 10. In addition, it is desirable that the temperature dependence of the breakdown voltage is substantially the same as that of first APD 10.

The anode of first APD 10 is electrically connected to the anode of second APD 20 via a resistor that is almost negligible. The connection point between the anode of first APD 10 and the anode of second APD 20 is described as node N. It should be noted that in photodetector 100, the anodes of first APD 10 and second APD 20 are electrically connected to each other, but the cathodes may be electrically connected to each other.

Node N is connected to power supply $V_{sub}$ via first resistor r1, the cathode of first APD 10 is connected to power supply $V_{dd}$ via third resistor r3, and the cathode of second APD 20 is connected to power supply Vd via second resistor r2.

At this time, assuming that the breakdown voltage of first APD 10 is $-V_{BD1}$ and the breakdown voltage of second APD 20 is $-V_{BD2}$, $V_{dd}$, $V_0$, and $V_{sub}$ are set to satisfy both $V_{sub}-V_{dd}<V_{BD1}$ and $V_{sub}-V_0<V_{BD2}$. This makes it possible to operate first APD 10 and second APD 20 in the so-called Geiger mode. It should be noted that the polarity of the voltage is positive for the forward bias, and $V_{BD1}<0$ and $V_{BD2}<0$ are satisfied.

Assuming that the resistance value of first resistor r1 is R1, the resistance value of second resistor r2 is R2, and the resistance value of third resistor r3 is R3, the resistance values are set so as to be R3>R1>R2.

A second reverse bias having a smaller absolute value than the first reverse bias is applied between the cathode and the anode of second APD 20. In FIG. 1, the first reverse bias is $V_{sub}-V_0$. First resistor r1 and second resistor r2 do not function as quenching elements, and pass a steady current through second APD 20. As will be described later, second APD 20 has a function of reducing the temperature dependence of the characteristics of first APD 10.

Here, the operating principle of the present disclosure will be described. Generally, the characteristics of APD are determined by the overvoltage, which is the difference between the reverse bias applied to the APD and the breakdown voltage. However, the breakdown voltage depends on the temperature. Therefore, in order to reduce the temperature dependence of the characteristics of the APD, it is also necessary to change the reverse bias applied to the APD according to the temperature to reduce the change in the overvoltage.

On the other hand, photodetector 100 can reduce the temperature change of the characteristics of first APD 10 by reducing the temperature dependence of the overvoltage of first APD 10 by second APD 20. It should be noted that the characteristics of APD refer to, for example, multiplication ratio, photon detection probability, and the like, but are not limited thereto.

First, the case of $V_{BD1}=V_{BD2}=V_{BD}$ will be considered. In the circuit configuration shown in FIG. 1, when resistance value R1 of first resistor r1 is sufficiently larger than resistance value R2 of second resistor r2, the current flowing through first resistor r1 is represented by the following equation.

[Math. 1]

$$I = \frac{V_{sub} - V_0 - V_{BD}(T)}{R_1} \quad \text{(Equation 1)}$$

At this time, the positive direction of the current is the direction of the forward bias from the anode to the cathode. In the above equation, $-V_{BD}(T)$ is the breakdown voltage of first APD 10 and second APD 20. At this time, voltage $V_N$ of node N is represented by the following equation due to the voltage drop due to resistance value R1.

[Math. 2]

$$V_N = V_{sub} - R_1 \left( \frac{V_{sub} - V_0 - V_{BD}(T)}{R_1} \right) = V_{BD}(T) + V_0 \quad \text{(Equation 2)}$$

Then, the voltage applied to first APD 10 is expressed by the following equation.

[Math. 3]

$$V_{dd} - V_N = V_{dd} - V_0 - V_{BD}(T) \quad \text{(Equation 3)}$$

Here, when overvoltage $V_{ov}$ is defined as the difference between the reverse bias applied to the APD and the breakdown voltage, overvoltage $V_{ov1}$ of first APD 10 is expressed by the following equation.

[Math. 4]

$$V_{ov1} = V_{dd} - V_0 - V_{BD}(T) - (-V_{BD}(T)) = V_{dd} - V_0 \quad \text{(Equation 4)}$$

As mentioned above, the characteristics of the APD generally depend on overvoltage $V_{ov}$. In photodetector 100, as represented by above Equation 4, since overvoltage $V_{ov1}$ of first APD 10 has no temperature dependence, the temperature dependence of the characteristics of first APD 10 is completely eliminated in the mathematical equation. That is, the temperature dependence of the characteristics of first APD 10 is reduced.

It should be noted that it is preferable that first APD 10 and second APD 20 have the same breakdown voltage, but first APD 10 and second APD 20 may have different breakdown voltages, and in this case, overvoltage $V_{ov1}$ of first APD 10 is expressed by the following equation.

[Math. 5]

$$V_{ov1} = V_{dd} - V_0 + V_{BD1}(T) - V_{BD2}(T) \quad \text{(Equation 5)}$$

Even in this case, the temperature changes of the breakdown voltage of first APD 10 and second APD 20 cancel each other out, and the temperature change of the breakdown voltage becomes smaller. For example, in the operating temperature range of photodetector 100, the temperature shift of the breakdown voltage difference (that is, $V_{BD1}(T)-V_{BD2}(T)$) is only needed to be smaller than overvoltage $V_{ov1}$. In a typical APD, the temperature shift is 50 mV/K for $V_{ov1}$=1 V to 5 V. Since the operating temperature range extends to several tens of degrees such as 0° C. to 60° C., the characteristics are affected, but the present disclosure can suppress temperature changes.

Figure 2A:
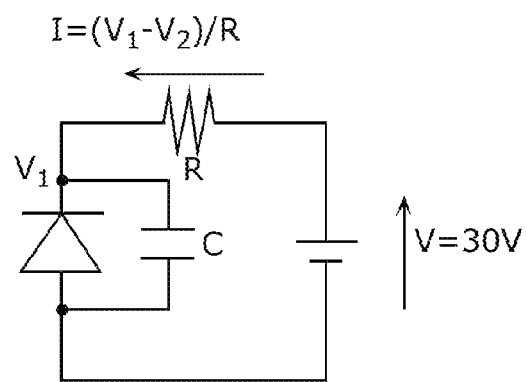
FIG. 2A is a diagram showing a circuit for simulating the characteristics of an APD.
Figure 2B:
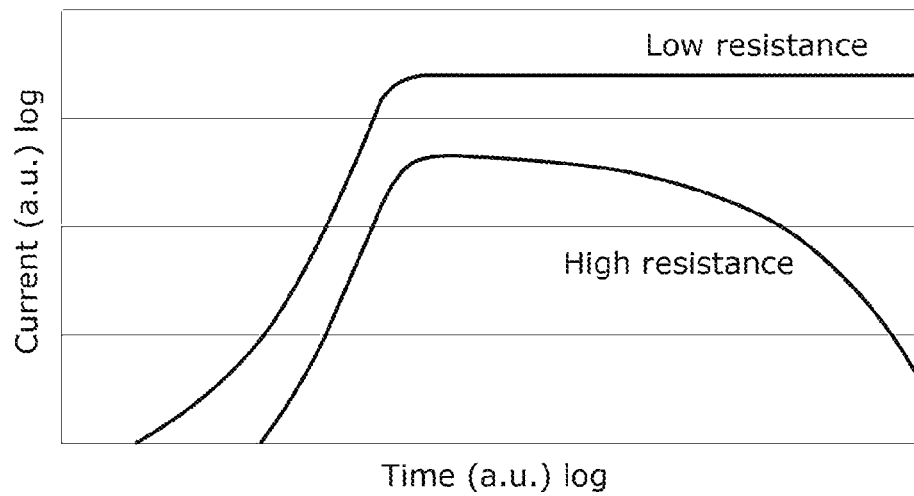
FIG. 2B is a diagram showing the results of the simulation of a current flowing through a resistor in the circuit in FIG. 2A.

Next, the requirements for the resistance value of photodetector 100 will be described with reference to FIG. 2A and FIG. 2B. FIG. 2A is a diagram showing a circuit for simulating the characteristics of the APD, where the value of the capacitance connected in parallel to the APD is C and the value of the resistor connected in series with the APD is R. FIG. 2B is a diagram showing the simulation results of a current flowing through a resistor in the circuit in FIG. 2A.

As shown in the graph described as "high resistance" in FIG. 2B, when the resistance value of the resistor connected in series with the APD is large, the current flows transiently and then stops due to so-called quenching. On the other hand, as shown in the graph described as "low resistance" in FIG. 2B, when the value of the resistance connected in series with the APD is small, the current continues to flow steadily.

Based on such simulation results, since a steady current needs to flow through second APD 20, first resistor r1 and second resistor r2, which are resistors connected in series with second APD 20, need to be set to sufficiently small resistance values so as not to cause quenching. Typically, resistance value R1 of first resistor r1 and resistance value R2 of second resistor r2 need to be less than about 10 kΩ.

In addition, the above-mentioned quenching needs to occur in first APD 10. For that reason, resistance value R3 of third resistor r3 connected in series with first APD 10 needs to be 10 kΩ or more. However, the threshold value of each resistance value is not limited to this value because it depends on the structure, capacitance, and bias condition of the APD.

Here, the configuration for feeding back the bias voltage of the photodetector with respect to the temperature is also described in PTL 4 and PTL 5. In PTL 4, since the bias is determined by using a transistor and a constant current source which have known temperature dependence, the device and the system must be configured including the temperature characteristics of the transistor and the constant current source. In addition, in PTL 5, the circuit configuration is complicated because the current or voltage flowing through the APD is monitored and the bias is changed by the feedback circuit.

On the other hand, since the present disclosure only uses an APD having the same characteristics as the photodetector, temperature feedback is possible with a simple configuration. In addition, since the APD having the same characteristics is used, there is an advantage that it is not necessary to consider the deviation of the temperature characteristics.

Here, the first resistor, the second resistor, and the third resistor are external resistors, diffusion resistors, wiring resistors, transistor resistors, or any combination thereof. There is no limitation on what kind of resistance each of the first resistance, the second resistance, and the third resistance is.

In addition, an amplifier circuit for amplifying the output signal of first APD 10 may be provided between first APD 10 and third resistor r3, or between third resistor r3 and power supply $V_{dd}$. This facilitates signal detection.

It should be noted that as described above, since the second reverse bias has a smaller absolute value than the first reverse bias, if the first breakdown voltage and the second breakdown voltage are about the same, the first overvoltage, which is the difference between the absolute value of the first reverse bias and the absolute value of the first breakdown voltage, is larger than the second overvoltage, which is the difference between the absolute value of the second reverse bias and the absolute value of the second breakdown voltage.

[Structure of Photodetector]

Figure 4:
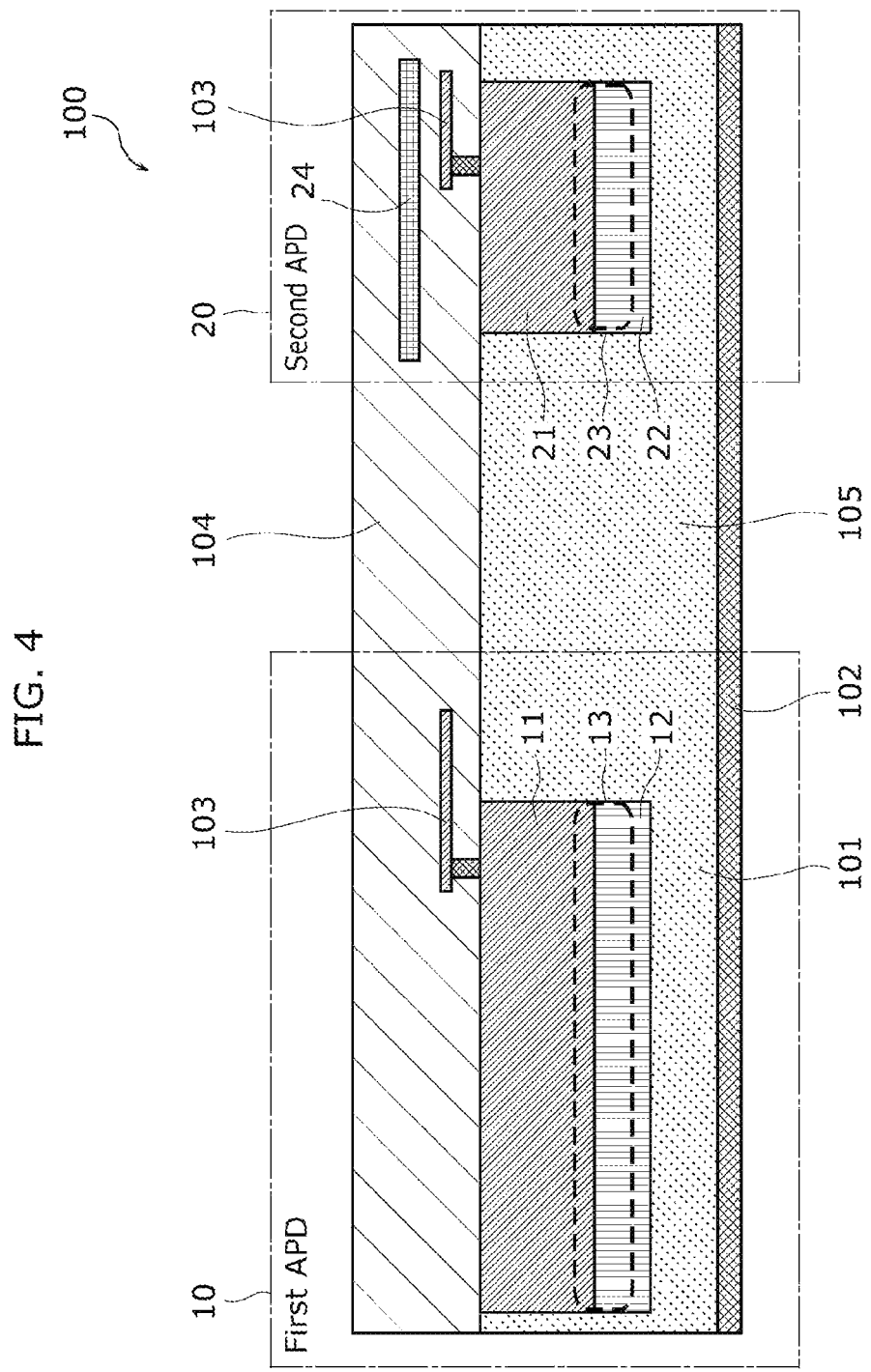
FIG. 4 is a cross-sectional view of the photodetector on the IV-IV line in FIG. 3.

Next, an example of the structure in the case where photodetector 100 is disposed on the same chip will be described. FIG. 3 is a plan view of photodetector 100. FIG. 4 is a cross-sectional view of photodetector 100 on the IV-IV line in FIG. 3. It should be noted that in FIG. 3, the illustration of insulating layer 104 and the like is omitted in order to make the positions of first APD 10 and second APD 20 easier to understand. In addition, in the following description, the first conductivity type is N type and the second conductivity type is P type, but the first conductivity type may be P type and the second conductivity type may be N type.

Photodetector 100 includes semiconductor substrate 101, first semiconductor layer 11, second semiconductor layer 12, third semiconductor layer 21, fourth semiconductor layer 22, light-shielding plate 24, conductor 102, wiring 103 and insulating layer 104. Light is incident on photodetector 100 from above (opposite to conductor 102) in the figure.

Semiconductor substrate 101 is a layer of the second conductivity type. First semiconductor layer 11 and second semiconductor layer 12 are located in semiconductor substrate 101 and form first APD 10. First semiconductor layer 11 is the first conductivity type, and second semiconductor layer 12 is the second conductivity type. First semiconductor layer 11 is located above (on the side where light is incident with respect to) second semiconductor layer 12. Multiplication region 13 (a portion surrounded by a broken line in the cross-sectional view) is formed at the boundary between first semiconductor layer and second semiconductor layer 12. Multiplication region 13 can multiply one signal charge to a large number, and according to multiplication region 13, it is possible to detect a weak light of one photon.

Third semiconductor layer 21 and fourth semiconductor layer 22 are located in semiconductor substrate 101 and form second APD 20. Third semiconductor layer 21 is located above (closer to the light incident surface side than) fourth semiconductor layer 22. Third semiconductor layer 21 is the first conductivity type, and fourth semiconductor layer 22 is the second conductivity type. Multiplication region 23 (a portion surrounded by a broken line in the cross-sectional view) is formed at the boundary between third semiconductor layer 21 and fourth semiconductor layer 22.

Light-shielding plate 24 (shown by a broken line in FIG. 3) is located above third semiconductor layer 21 and shields light in multiplication region 23. Light-shielding plate 24 is formed of a material having a higher light-shielding property than semiconductor substrate 101. Light-shielding plate 24 is formed of, for example, a metal material. For light-shielding plate 24, a wiring layer may be used or a plurality of wiring layers may be used. In a plan view, the area of light-shielding plate 24 is larger than that of second APD 20 (third semiconductor layer 21).

Conductor 102 is a member for applying substantially the same potential to second semiconductor layer 12 and fourth semiconductor layer 22. Conductor 102 is disposed on the lower surface (the surface opposite to the light incident side) of semiconductor substrate 101 and covers the lower surface. Conductor 102 is formed of, for example, a metal material, but may be formed of a semiconductor of the second conductivity type. First APD 10 is electrically connected to second APD 20 via semiconductor substrate 101 or conductor 102 disposed on the back surface of semiconductor substrate 101.

Wiring 103 is a wiring for electrically connecting each of first APD 10 and second APD 20 to a peripheral circuit or the like. Wiring 103 is formed of a metal material.

Insulating layer 104 is a film having insulating properties and translucent properties that covers the upper surface (light incident surface) of semiconductor substrate 101. Insulating layer 104 is formed of, for example, silicon oxide ($SiO_x$) or the like.

In this way, photodetector 100 has a structure in which first APD 10 and second APD 20 are disposed on the same semiconductor substrate 101. With this, first APD 10 and second APD 20 can be provided at the same time with a single chip. In addition, it is preferable that first APD 10 and second APD 20 are manufactured under the same process conditions. With this, first breakdown voltage VBD1 and second breakdown voltage VBD2 have the same value and the same temperature dependence, so that the temperature fluctuation of the characteristics of first APD 10 can be suppressed.

In addition, if first semiconductor layer 11 and third semiconductor layer 21 have substantially the same concentration profile, and second semiconductor layer 12 and fourth semiconductor layer 22 have substantially the same concentration profile, the breakdown characteristic of first APD 10 and the breakdown characteristic of second APD 20 can be made substantially the same. With this, the above-mentioned $V_{BD1}(T)-V_{BD2}(T)$ can be brought close to 0. At this time, by setting the bias voltage so as to satisfy the relationships of $V_{sub}-V_{dd}<V_{BD1}$, $V_{sub}-V_0<V_{BD2}$, and $V_{dd}>V_0$, the temperature dependence of the overvoltage of first APD 10 is reduced. It should be noted that by forming first semiconductor layer 11 and third semiconductor layer 21 by the same impurity injection step, it is possible to simplify the chip manufacturing step while making the concentration profiles substantially the same. The same applies to second semiconductor layer 12 and fourth semiconductor layer 22.

First APD 10 and second APD 20 are separated by separator 105. Separator 105 is formed of a semiconductor layer of the second conductivity type as a part of semiconductor substrate 101. With this, the generation of dark current can be reduced and the S/N ratio can be improved. In separator 105, the concentration of impurities of the second conductivity type is reduced so that breakdown does not occur in separator 105. Specifically, the concentration of impurities of separator 105 is lower than the concentration of impurities of second semiconductor layer 12. It should be noted that a trench structure or the like may also be used as separator 105, and the specific configuration of separator 105 is not particularly limited.

In addition, as shown in FIG. 3, the area of first APD 10 is larger than the region of second APD 20 in a plan view. This improves the photosensitivity or aperture ratio of photodetector 100.

In addition, the area of multiplication region 13 may be substantially the same as the region of multiplication region 23. With this, the breakdown voltages of first APD 10 and second APD 20 can be brought close to each other. In this way, in a plan view, the area of first APD 10 is preferably equal to or larger than the area of second APD 20.

In the figure, first semiconductor layer 11 and second semiconductor layer 12 have the same width in the horizontal direction of semiconductor substrate 101, but they do not necessarily have to be the same width. In addition, at least one of first semiconductor layer 11 or second semiconductor layer 12 may have a so-called guard ring structure in which the concentration of impurities at the end portion is reduced, as in PTL 4. In addition, first APD 10 may be a so-called PIN type APD in which an intrinsic semiconductor layer is added between first semiconductor layer 11 and second semiconductor layer 12. In this way, the present disclosure is not limited to the device structure of the APD.

[Structure with a Separator having a Light-Shielding Property]

Figure 5:
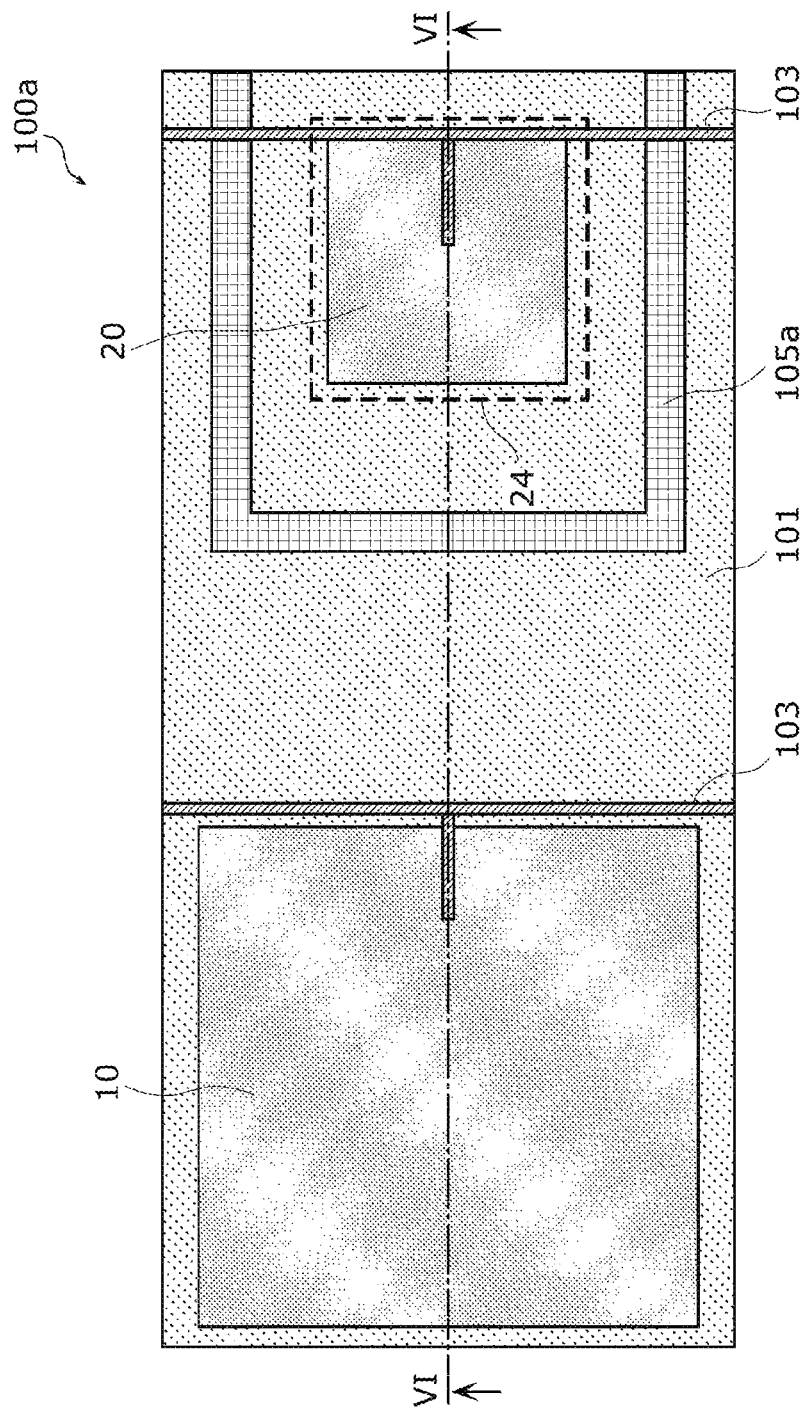
FIG. 5 is a plan view of a photodetector including a separator having a light-shielding property.
Figure 6:
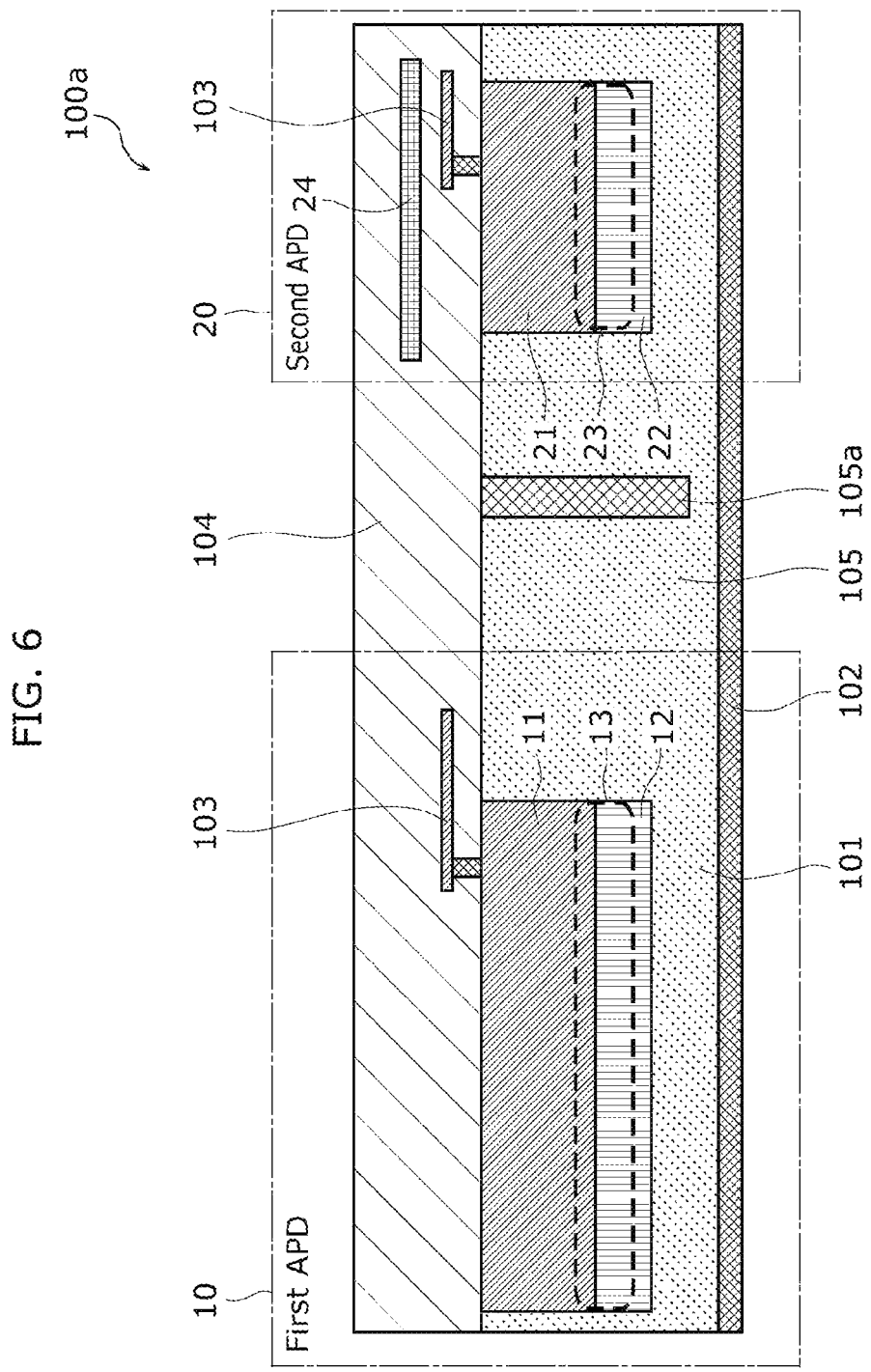
FIG. 6 is a cross-sectional view of the photodetector on the VI-VI line in FIG. 5.

Photodetector 100 may include a separator having a light-shielding property. FIG. 5 is a plan view of a photodetector including a separator having a light-shielding property. FIG. 6 is a cross-sectional view of the photodetector on the VI-VI line in FIG. 5. It should be noted that in FIG. 5, the illustration of insulating layer 104 and the like is omitted in order to make the positions of first APD 10 and second APD 20 easier to understand.

Photodetector 100a shown in FIG. 5 and FIG. 6 has a structure in which separator 105a is added to photodetector 100. Separator 105a is only needed to be disposed so as to surround multiplication region 23 in a plan view, and to be configured to prevent optical crosstalk between multiplication region 13 and multiplication region 23. Separator 105a may be formed of a material having a high light reflection rate or a material having a high light absorption rate. For example, a trench may be formed in the semiconductor substrate and a metal such as aluminum may be embedded in the trench. In addition, separator 105a may be formed of materials having different dielectric constants. For example, a trench may be formed in the semiconductor substrate and silicon nitride or silicon oxide may be embedded. In addition, when a trench is formed in separator 105a, it is preferable that the surface of the trench portion is covered with a protective film that inactivates the surface. Here, the protective film is a high-concentration impurity layer or the like.

In the APD, since the number of electrons and holes in the depletion layer increases due to the avalanche multiplication, the probability of light generation due to the recombination of electron-hole pairs in the depletion layer increases. Since a current flows constantly in second APD 20, light due to recombination is likely to be generated. When the generated light enters first APD 10, it becomes noise and the S/N ratio decreases. According to separator 105a having a high light-shielding property, such noise is reduced.

Here, although not shown, a region to discharge the electric charge generated thermally in semiconductor substrate 101 or the electric charge generated by photoelectric conversion outside the light detection region may be provided in semiconductor substrate 101. Specifically, a semiconductor layer of the first conductivity type is disposed on the surface of the semiconductor substrate so as to surround either first APD 10 or second APD 20 or both first APD 10 and second APD 20, and is connected to a power supply so that electric charges can be discharged. With this, it is possible to reduce noise and prevent malfunction.

[Structure in which a Semiconductor Layer of the Second Conductivity Type is Shared]

Figure 7:
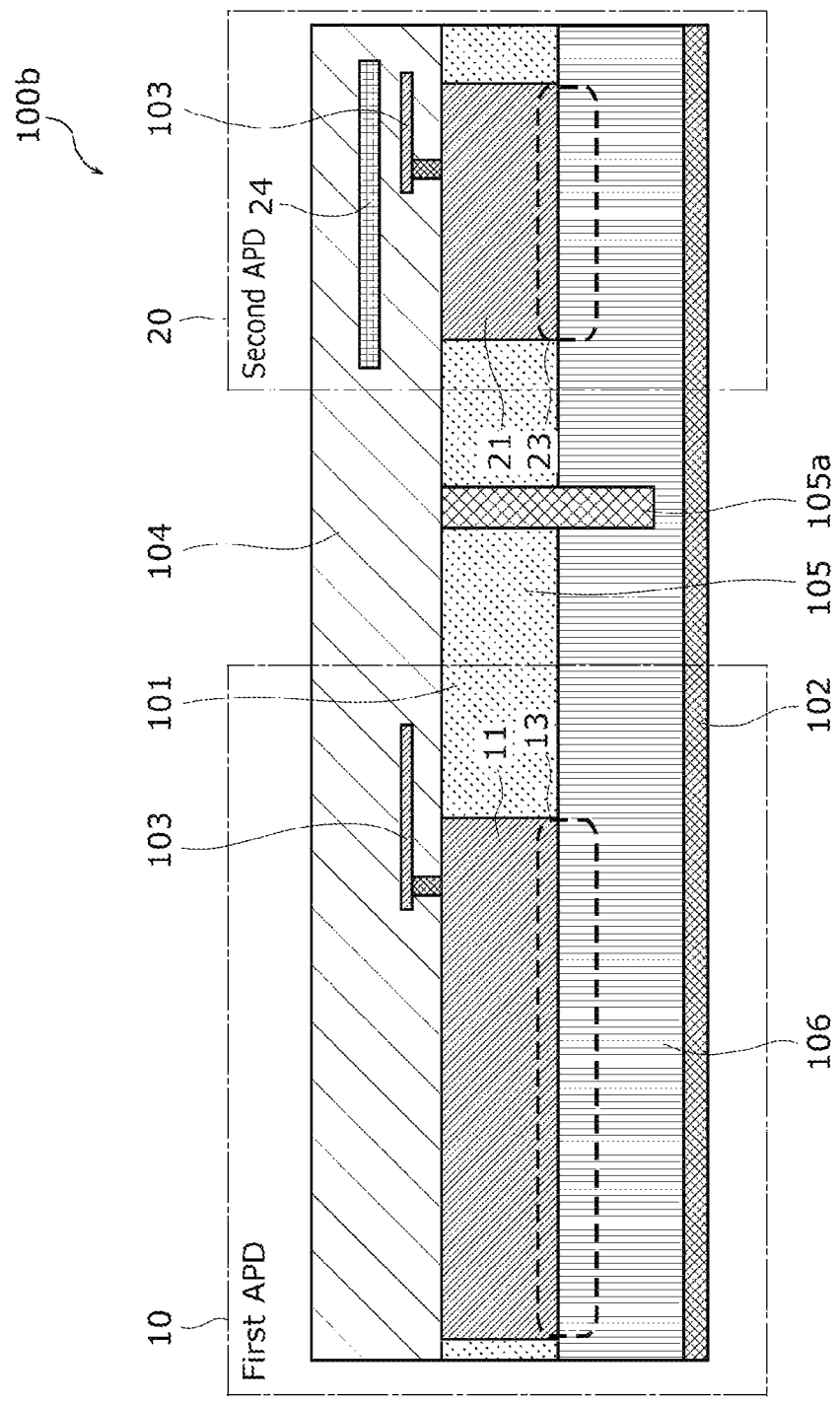
FIG. 7 is a cross-sectional view of a photodetector having a structure in which a semiconductor layer of a second conductivity type is shared.

In the above-mentioned photodetector (for example, photodetector 100a), second semiconductor layer 12 included in first APD 10 and fourth semiconductor layer 22 included in second APD 20 may be integrally formed. That is, first APD 10 and second APD 20 may share a semiconductor layer of the second conductivity type. FIG. 7 is a cross-sectional view of a photodetector having a structure in which a semiconductor layer of the second conductivity type is shared.

Second semiconductor layer 106 included in photodetector 100b shown in FIG. 7 is a semiconductor layer of the second conductivity type shared by first APD 10 and second APD 20, and corresponds to the semiconductor layer in which second semiconductor layer 12 and fourth semiconductor layer 22 in photodetector 100a are integrally formed. Second semiconductor layer 106 may be formed by performing ion implantation such that first APD 10 is connected to second APD 20, or may be formed by adjusting the concentration of impurities at the time of producing semiconductor substrate 101.

According to such second semiconductor layer 106, it can be suppressed that the difference in the breakdown voltages between first APD 10 and second APD 20 occurs. In addition, if the portion that is multiplication region 13 (or multiplication region 23) of second semiconductor layer 106 is formed by epitaxial growth, noise is reduced.

In FIG. 7, since second semiconductor layer 106 is formed wider than first semiconductor layer 11 and third semiconductor layer 21, there is a concern that the electric field is concentrated at the end portions of first semiconductor layer 11 and third semiconductor layer 21. Therefore, it is preferable that first semiconductor layer 11 and third semiconductor layer 21 are provided with an impurity concentration distribution so that the peripheral portion has a lower concentration than the center portion to prevent electric field concentration. In addition, a so-called guard ring structure may be formed as in PTL 4.

[Structure with a Resistor Formed by a Semiconductor Manufacturing Process]

Figure 8:
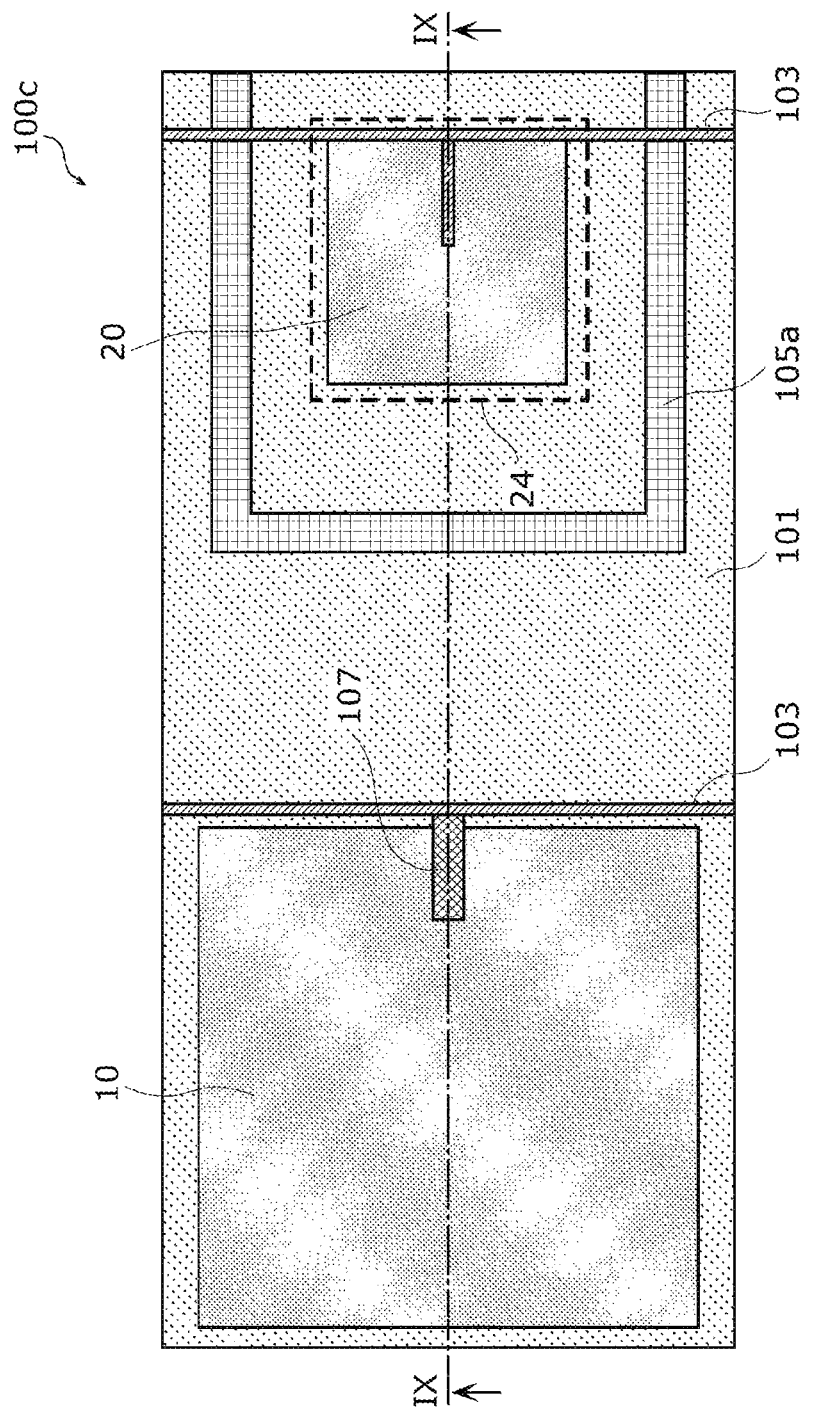
FIG. 8 is a plan view of a photodetector including a resistor which is formed by a semiconductor manufacturing process and corresponds to a third resistor.
Figure 9:
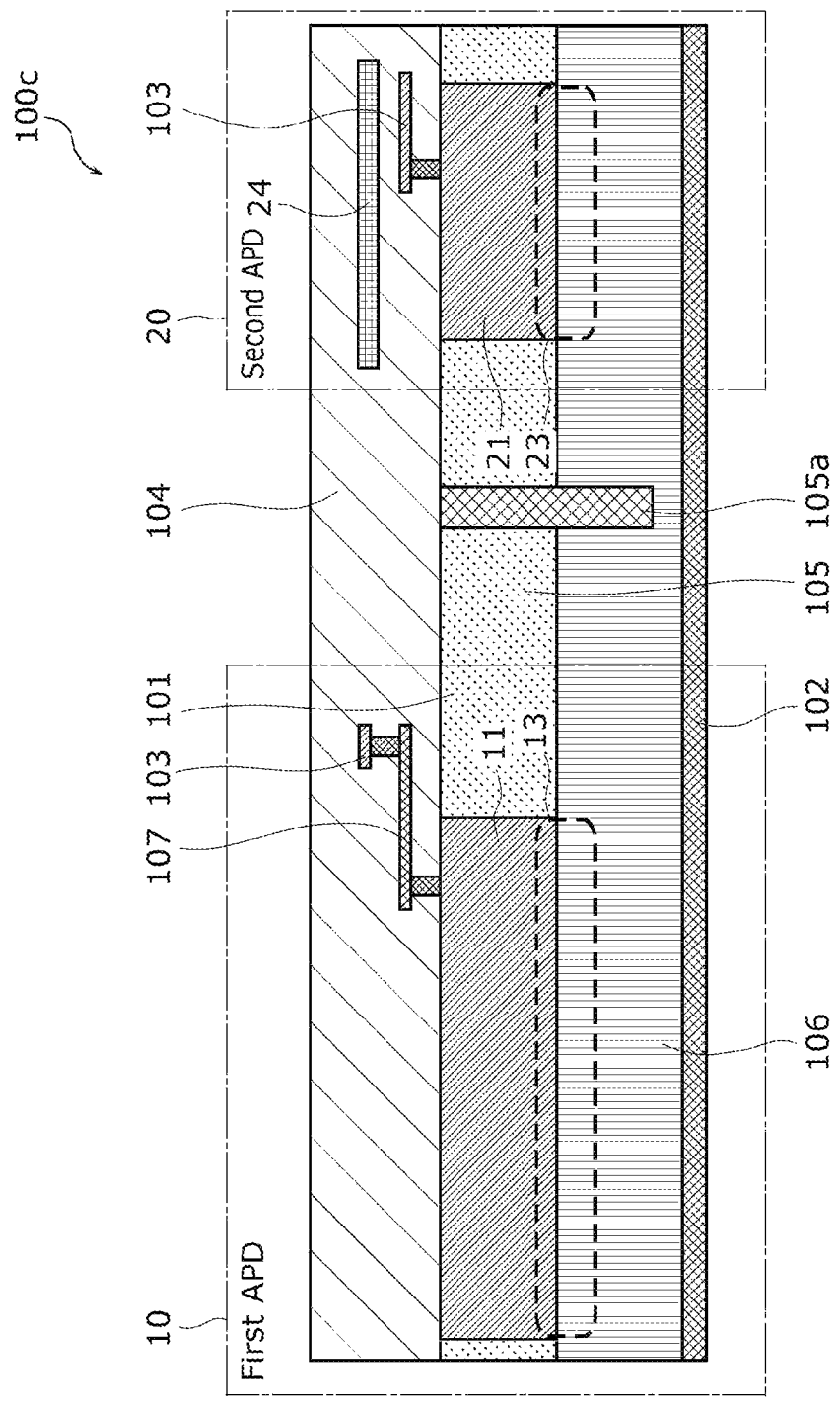
FIG. 9 is a cross-sectional view of the photodetector on the IX-IX line in FIG. 8.

In the above-mentioned photodetector (for example, photodetector 100b), third resistor r3 may be formed by a semiconductor manufacturing process. FIG. 8 is a plan view of a photodetector including a resistor which is formed by a semiconductor manufacturing process and corresponds to third resistor r3. FIG. 9 is a cross-sectional view of the photodetector on the IX-IX line in FIG. 8. It should be noted that in FIG. 8, the illustration of insulating layer 104 and the like is omitted.

Photodetector 100c shown in FIG. 8 and FIG. 9 includes resistor 107 electrically connected to first APD 10 in insulating layer 104. Resistor 107 is formed by a semiconductor manufacturing process from a high resistance material such as polysilicon or oxide.

Figure 10:
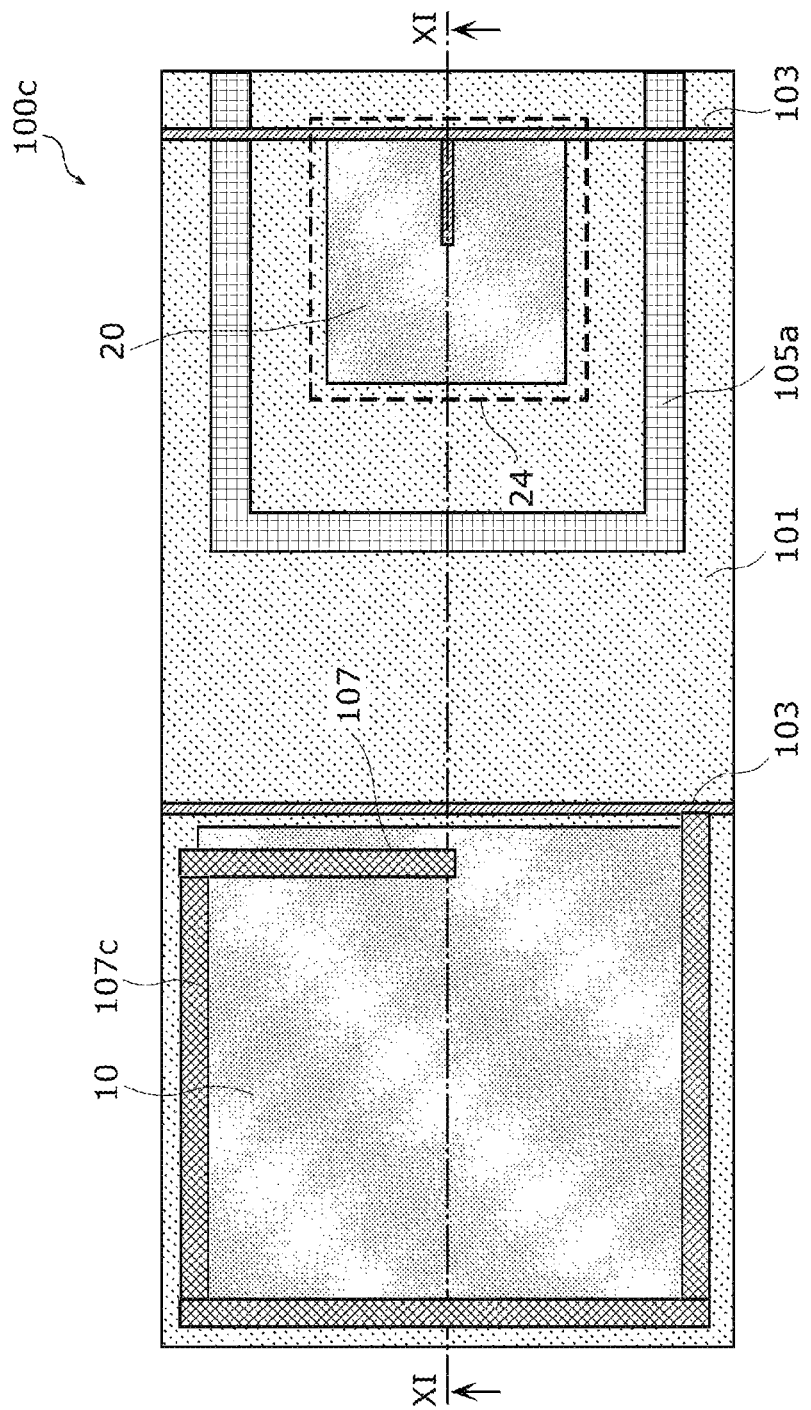
FIG. 10 is a plan view of a photodetector including a vortex-shaped resistor corresponding to a third resistor.
Figure 11:
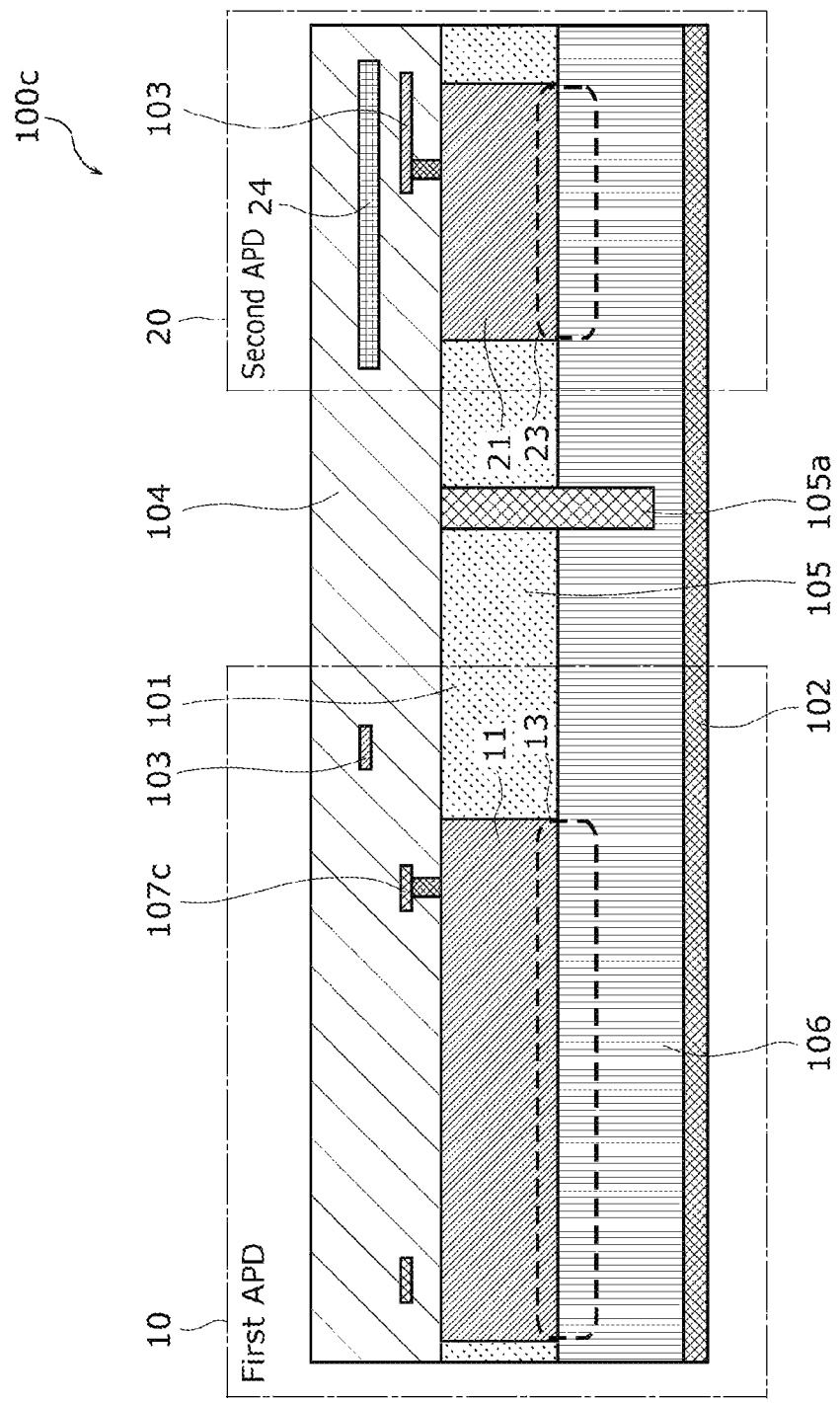
FIG. 11 is a cross-sectional view of the photodetector on the XI-XI line in FIG. 10.

It should be noted that the shape of resistor 107 is not particularly limited. For example, resistor 107 may be disposed above first APD 10 and have a vortex shape (in other words, a wound shape). FIG. 10 is a plan view of photodetector 100c including vortex-shaped resistor 107c corresponding to third resistor r3. FIG. 11 is a cross-sectional view of photodetector 100c on the XI-XI line in FIG. 10. It should be noted that in FIG. 10, the illustration of insulating layer 104 and the like is omitted. Since the resistance value is proportional to the length of the resistor, the resistance of resistor 107c can be easily increased.

[Structure 1 in which the First APDs are Arranged in an Array]

Figure 12:
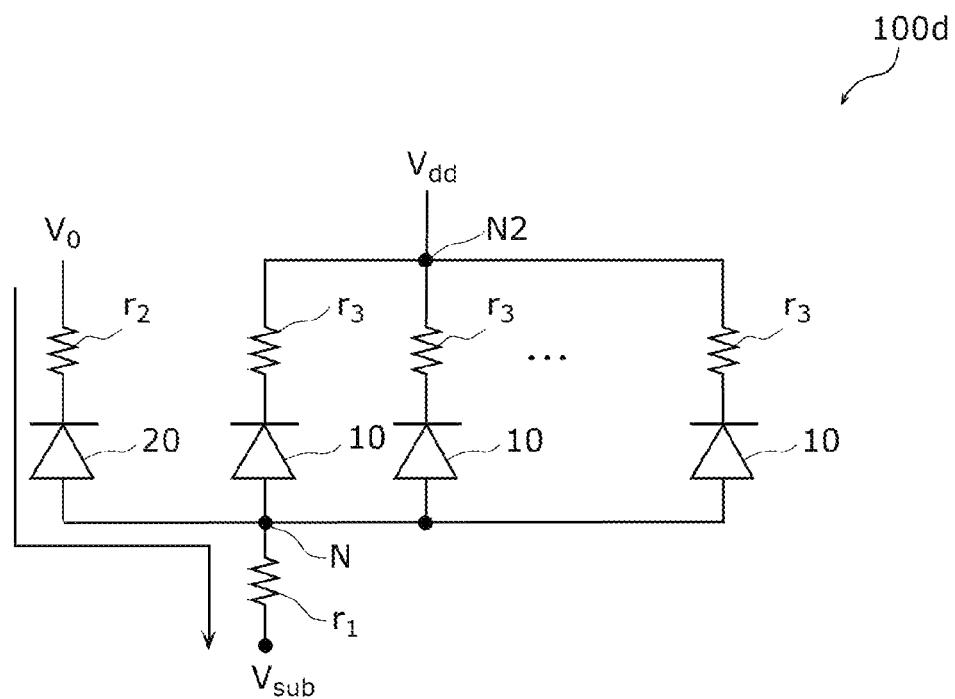
FIG. 12 is a diagram showing a circuit configuration of a photodetector including a plurality of first APDs arranged in an array.

The above-mentioned photodetector may include a plurality of first APDs 10 arranged in an array. FIG. 12 is a diagram showing a circuit configuration of a photodetector including a plurality of first APDs 10 arranged in an array. The arrow in FIG. 12 indicates the direction in which a current having a negative polarity flows.

Photodetector 100d shown in FIG. 12 includes a plurality of first APDs 10 with respect to one second APD 20. In each of the plurality of first APDs 10, the cathode is electrically connected to node N2 via third resistor r3. Power supply $V_{dd}$ is electrically connected to node N2. The anode of each of the plurality of first APDs 10 is electrically connected to node N. The anode of second APD 20 is also electrically connected to node N. The number of first APDs 10 arranged in an array is not particularly limited.

In such photodetector 100d, when a plurality of photons are simultaneously incident on photodetector 100d, the number of incident photons can be obtained by associating the number of responded first APDs 10 according to the amount of current or voltage change. In addition, photodetector 100d may include a circuit that outputs the number of responded first APD 10.

Figure 13:
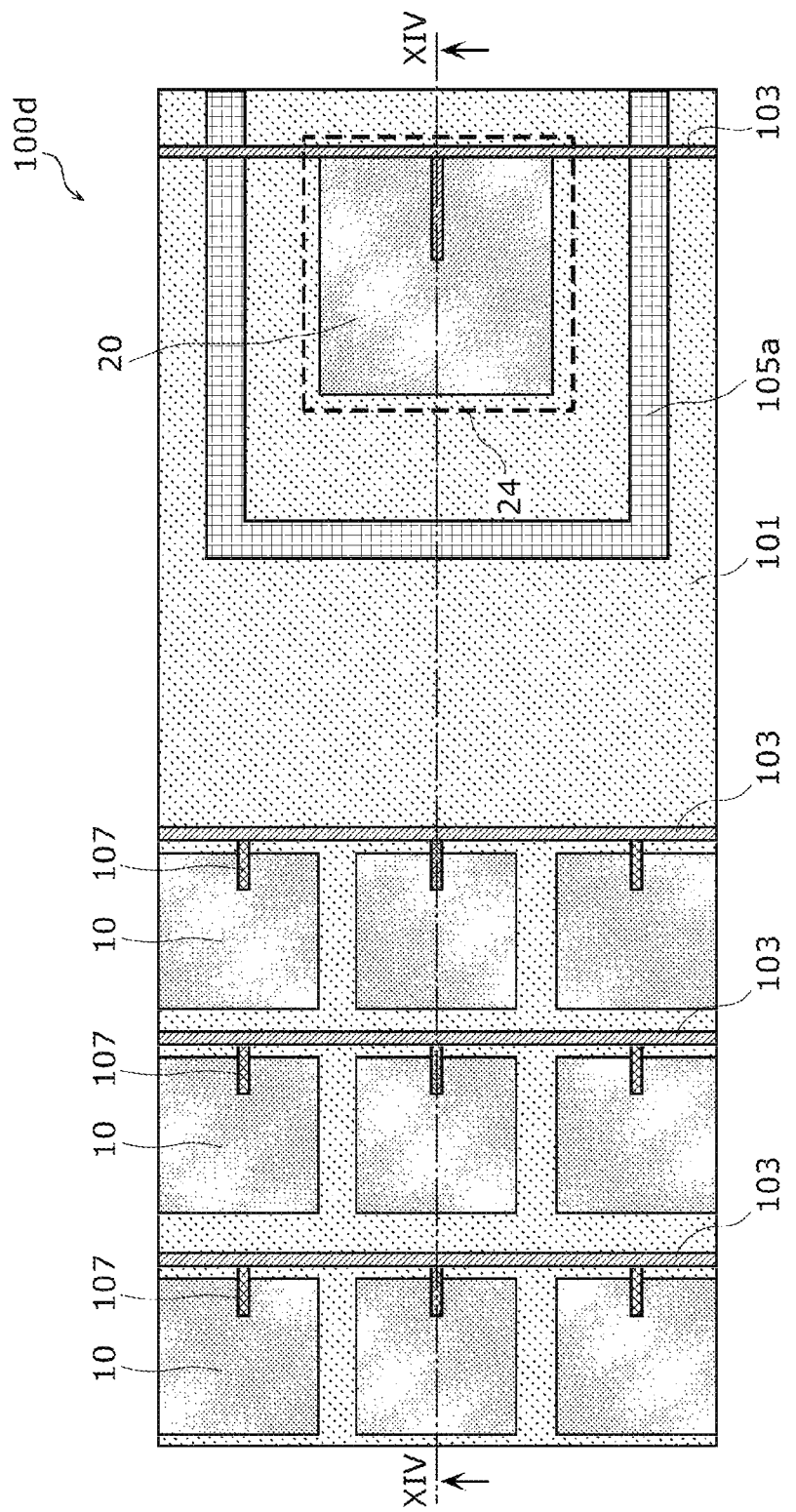
FIG. 13 is a plan view of a photodetector including a plurality of first APDs arranged in an array.
Figure 14:
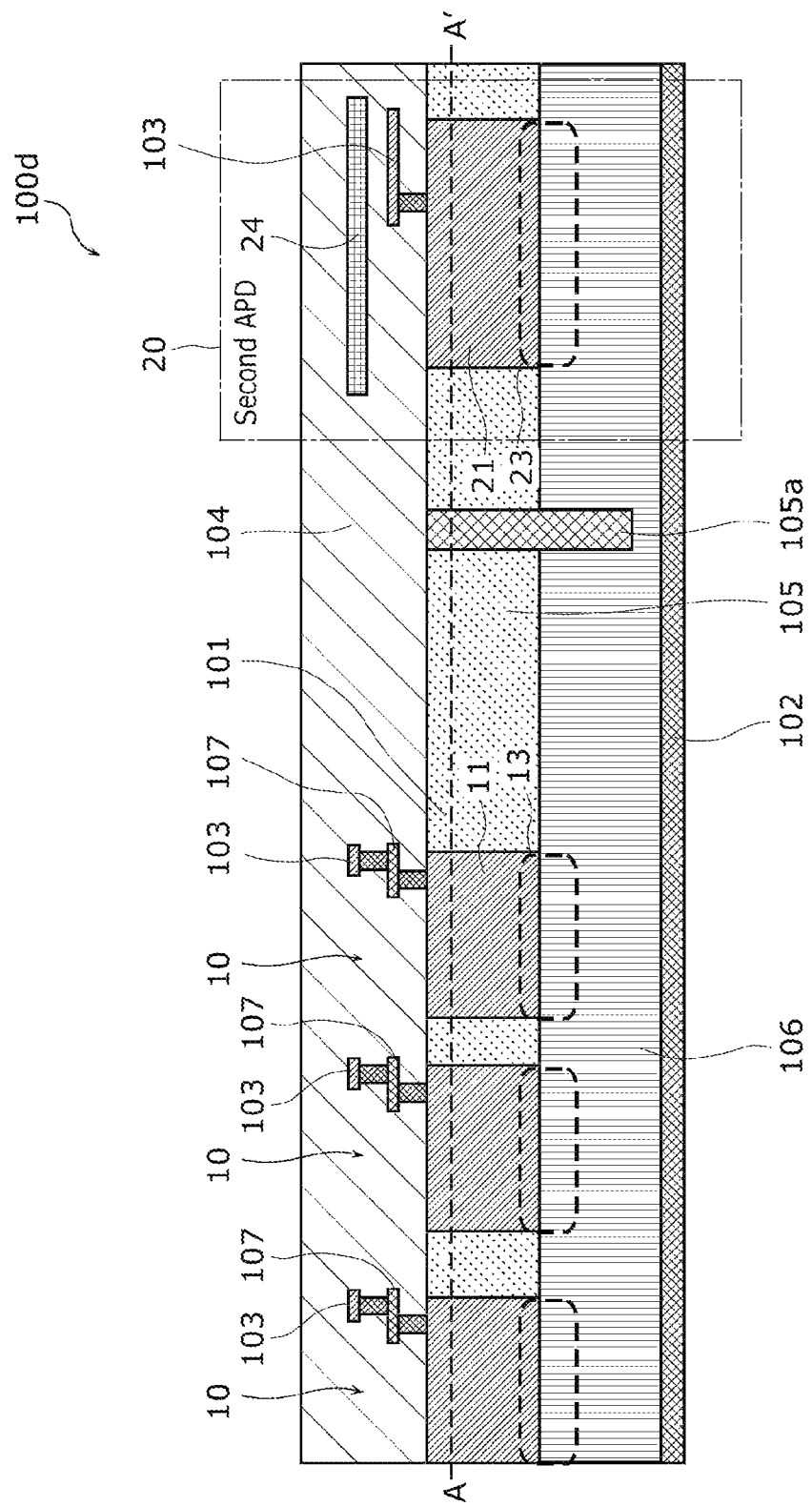
FIG. 14 is a cross-sectional view of the photodetector on the XIV-XIV line in FIG. 13.

Next, the structure of photodetector 100d will be described. FIG. 13 is a plan view of photodetector 100d. FIG. 14 is a cross-sectional view of photodetector 100d on the XIV-XIV line in FIG. 13. It should be noted that in FIG. 13, the illustration of insulating layer 104 and the like is omitted.

A plurality of first APDs 10 included in photodetector 100d are arranged in a matrix in a plan view, and first APDs 10 belonging to the same column are electrically connected to same wiring 103 via resistors 107. This reduces the number of wirings 103.

In addition, second semiconductor layer 106 included in photodetector 100d is a semiconductor layer of the second conductivity type shared by the plurality of first APDs 10 and second APD 20. Second semiconductor layer 106 may be formed by performing ion implantation such that the plurality of first APDs 10 are connected to second APD 20, or is formed by adjusting the concentration of impurities at the time of producing semiconductor substrate 101.

According to such second semiconductor layer 106, it can be suppressed that the difference in the breakdown voltages between first APD 10 and second APD 20 occurs. In addition, if the portion that is multiplication region 13 (or multiplication region 23) of second semiconductor layer 106 is formed by epitaxial growth, noise is reduced.

Although FIG. 14 shows a diagram in which second semiconductor layer 106 is shared by the plurality of first APDs 10 and second APD 20, the plurality of first APDs 10 and second APD 20 may each include different second semiconductor layer 106. In FIG. 14, two adjacent first APDs 10 are separated by a potential. With this, the overflow of the charges between adjacent first APDs 10 is suppressed, and the output error is suppressed. Here, it is preferable that adjacent first APDs 10 are separated by a depletion layer. With this, the separation width of adjacent first APDs 10 can be reduced, the aperture ratio can be improved, and the light sensitivity can be improved. In addition, a trench or a contact may be formed in the separation region between adjacent first APDs 10, or the above-mentioned guard ring structure or the like may be formed.

When the first APDs are arranged in an array, the breakdown voltage may change due to the difference in the electric field profile between the first APD at the center of the array and first APD 10 on the outermost periphery. Therefore, it is preferable that the signal of first APD 10 on the outermost periphery of the array is not used among first APDs 10. It is preferable that first APD 10 on the outermost periphery of the array is preferably prevented from breaking down by connecting first APD 10 on the outermost periphery of the array to another power supply $V_{OUT}$ and setting $V_{OUT} < V_{dd}$ so that first APD 10 on the outermost periphery of the array does not break down.

[Structure 2 in which the First APDs is Arranged in an Array]

Figure 15:
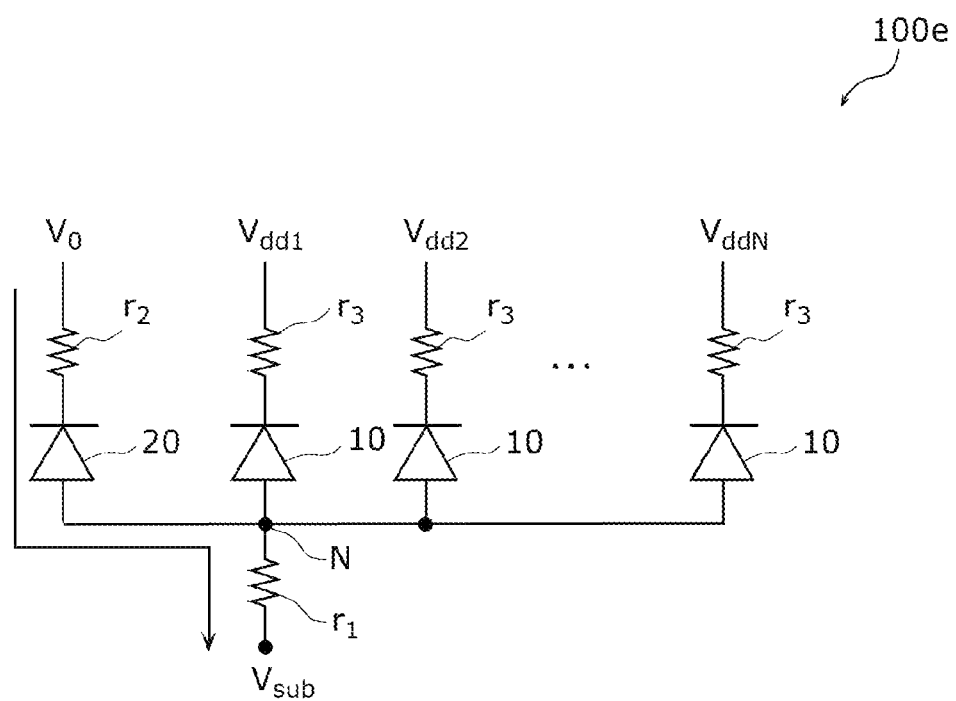
FIG. 15 is a diagram showing a circuit configuration of a photodetector including a plurality of first APDs arranged in an array, each of which is connected to a different power supply.

One end of each of a plurality of first APDs 10 arranged in an array may be connected to a different power supply. FIG. 15 is a diagram showing a circuit configuration of a photodetector including a plurality of first APDs 10 arranged in an array in which each of the cathodes of the plurality of first APDs 10 is connected to a different power supply. The arrow in FIG. 15 indicates the direction in which a current having a negative polarity flows.

Photodetector 100e shown in FIG. 15 includes a plurality of first APDs 10 with respect to one second APD 20. In each of the plurality of first APDs 10, the cathode is electrically connected to power supply $V_{ddi}$ (i=1, 2, . . . N) via third resistor r3. That is, the cathodes of the plurality of first APDs 10 are electrically connected to different power supplies from one another. The number of first APDs 10 arranged in an array is not particularly limited.

Such photodetector 100e can use each of the plurality of first APDs 10 as a pixel and acquire a signal for each pixel. Photodetector 100e can be used as an image pickup device by combining with an appropriate optical system, forming an image of incident light, and matching the coordinates of the plurality of first APDs 10 with the light output.

Figure 16:
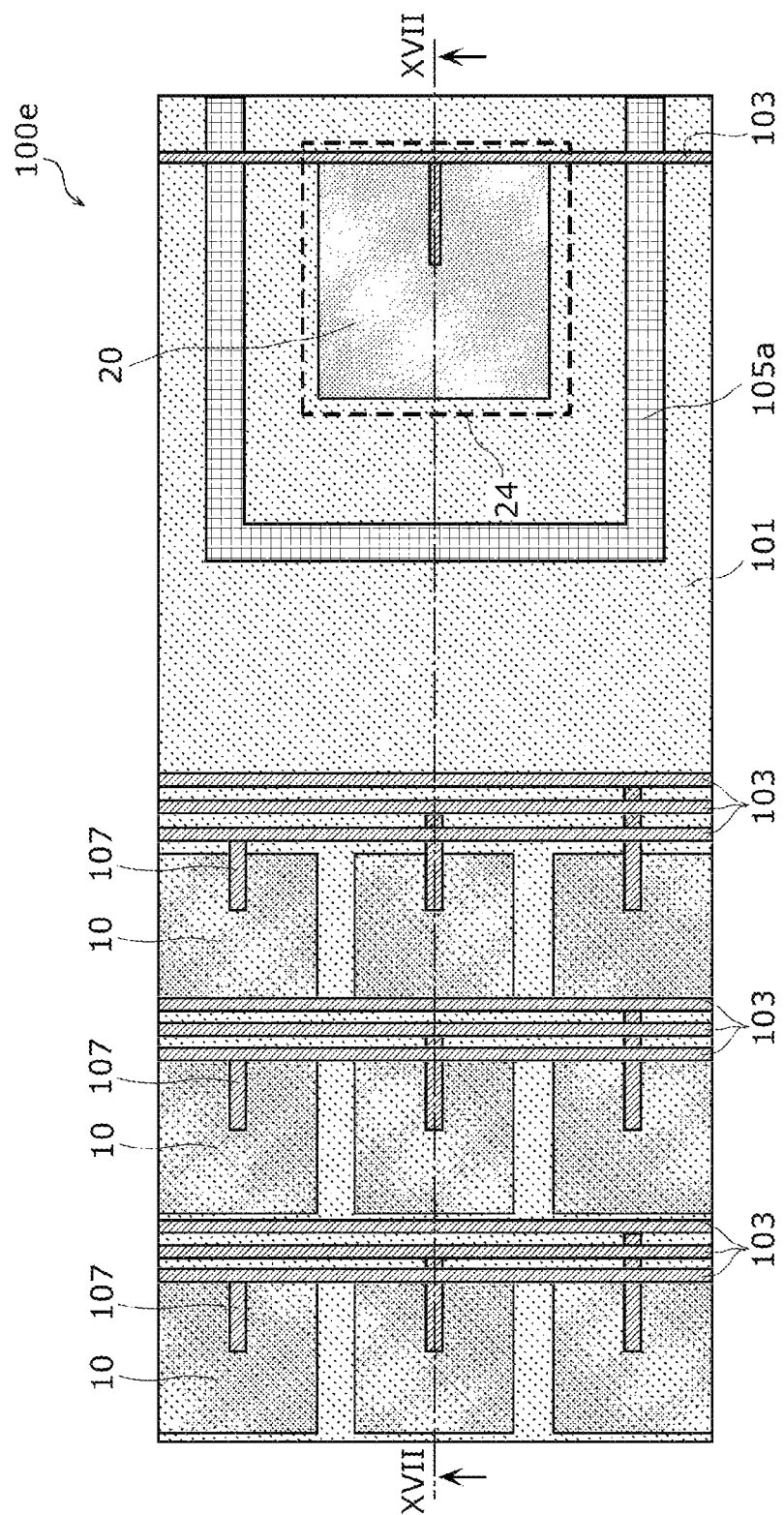
FIG. 16 is a plan view of a photodetector including a plurality of first APDs arranged in an array, each of which is connected to a different power supply.
Figure 17:
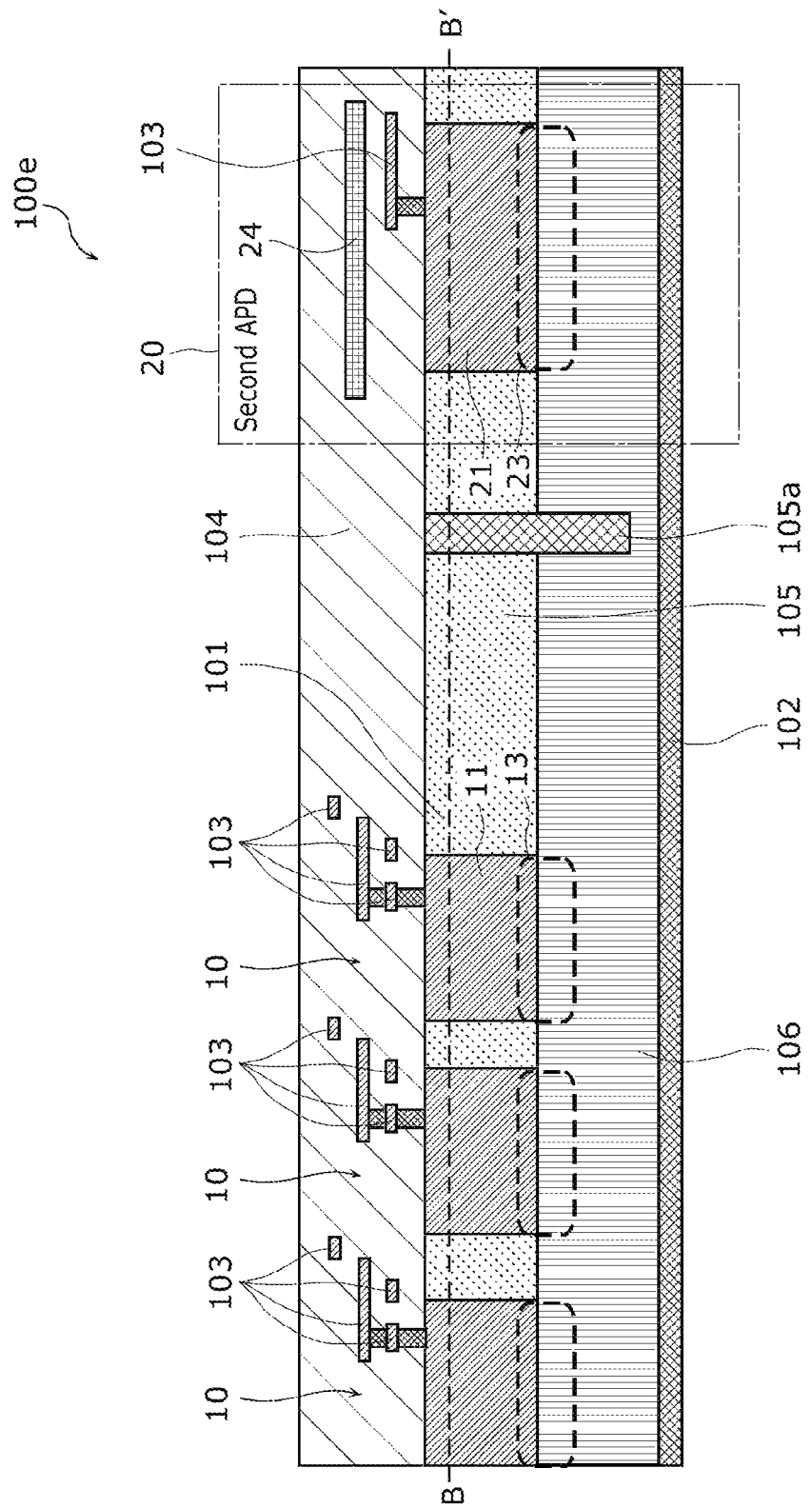
FIG. 17 is a cross-sectional view of the photodetector on the XVII-XVII line in FIG. 16.

Next, the structure of photodetector 100e will be described. FIG. 16 is a plan view of photodetector 100e. FIG. 17 is a cross-sectional view of photodetector 100e on the XVII-XVII line in FIG. 16. It should be noted that in FIG. 16, the illustration of insulating layer 104 and the like is omitted.

The plurality of first APDs 10 included in photodetector 100e are arranged in a matrix in a plan view, and the plurality of first APDs 10 are electrically connected to wirings 103 different from each other. With this, power supplies different from one another can be electrically connected to the plurality of first APDs 10, respectively.

In addition, second semiconductor layer 106 included in photodetector 100e is a semiconductor layer of the second conductivity type shared by the plurality of first APDs 10 and second APD 20. Second semiconductor layer 106 may be formed by performing ion implantation such that the plurality of first APDs 10 are connected to second APD 20, or may be formed by adjusting the concentration of impurities at the time of producing semiconductor substrate 101.

According to such second semiconductor layer 106, it is possible to suppress a difference in breakdown voltage between first APDs 10 and second APD 20. In addition, if the portion that is multiplication region 13 (or multiplication region 23) of second semiconductor layer 106 is formed by epitaxial growth, noise is reduced.

Although FIG. 17 shows a diagram in which second semiconductor layer 106 is shared by the plurality of first APDs 10 and second APD 20, the plurality of first APDs 10 and second APD 20 may each include different second semiconductor layer 106.

In FIG. 17, two adjacent first APDs 10 are separated by a potential. With this, the overflow of the charges between adjacent first APDs 10 is suppressed, and the output error is suppressed. Here, it is preferable that adjacent first APDs 10 are separated by a depletion layer. With this, the separation width of adjacent first APDs 10 can be reduced, the aperture ratio can be improved, and the light sensitivity can be improved. In addition, a trench or a contact may be formed in the separation region between adjacent first APDs 10, or the above-mentioned guard ring structure or the like may be formed.

When the first APDs are arranged in an array, the breakdown voltage may change due to the difference in the electric field profile between first APD 10 at the center of the array and first APD 10 on the outermost periphery. Therefore, it is preferable that the signal of first APD 10 on the outermost periphery of the array is not used among first APDs 10. It is preferable that first APD 10 on the outermost periphery of the array is preferably prevented from breaking down by connecting first APD 10 on the outermost periphery of the array to another power supply $V_{OUT}$ and setting $V_{OUT} < V_{dd}$ so that first APD 10 on the outermost periphery of the array does not break down.

Figure 18:
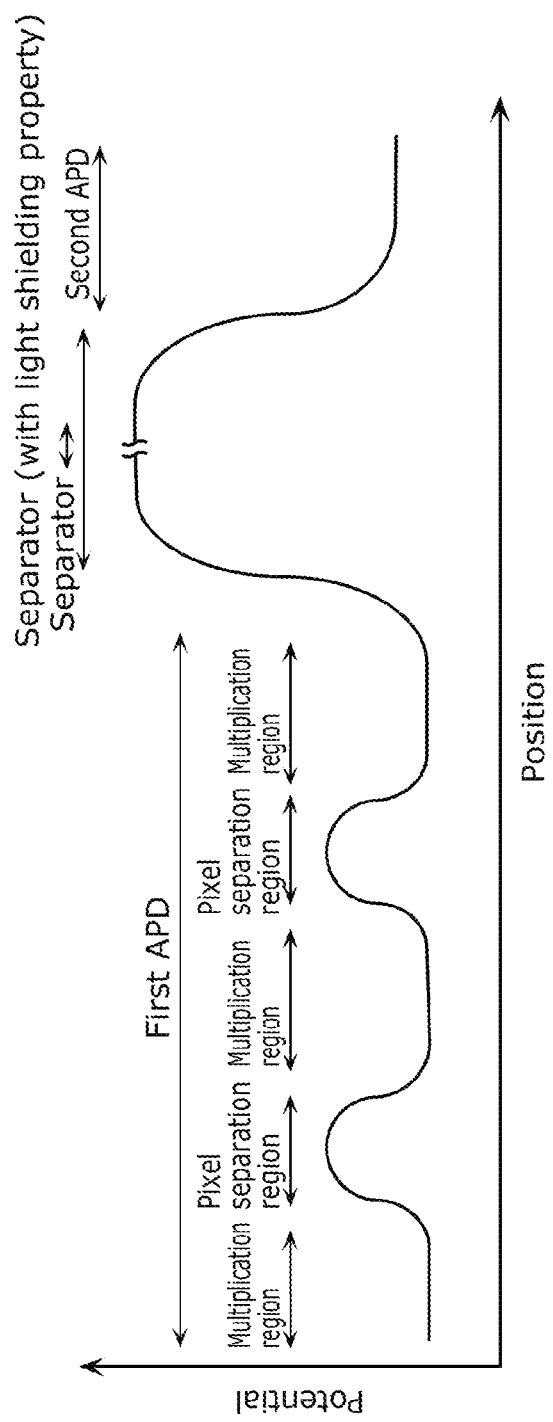
FIG. 18 is a diagram showing the potential of the photodetector in which the first APDs are arranged in an array.

It should be noted that FIG. 18 is a diagram showing the potential in the direction horizontal to the substrate surface in the photodetector in which first APDs 10 are arranged in an array such as photodetector 100d or photodetector 100e, and corresponds to the potential on A-A' in FIG. 14 or B-B' in FIG. 17. If adjacent first APDs 10 are separated by the potential, the electric charge generated by one first APD 10 is suppressed from leaking to adjacent first APDs 10, and overflow does not occur. For this reason, the image pickup device realized by photodetector 100d or photodetector 100e (in other words, the solid-state image pickup device) can prevent erroneous detection and can further realize image output without blooming. In particular, if the inter-pixel separation region between two first APDs 10 is depleted, the width of the separation region can be narrowed, the aperture ratio can be improved, and the light sensitivity can be increased.

In addition, first APDs 10 are also separated with second APD 20 by the potential. This region is a low electric field region so that breakdown does not occur.

Embodiment 2

[Circuit Configuration of Photodetector]

Figure 19:
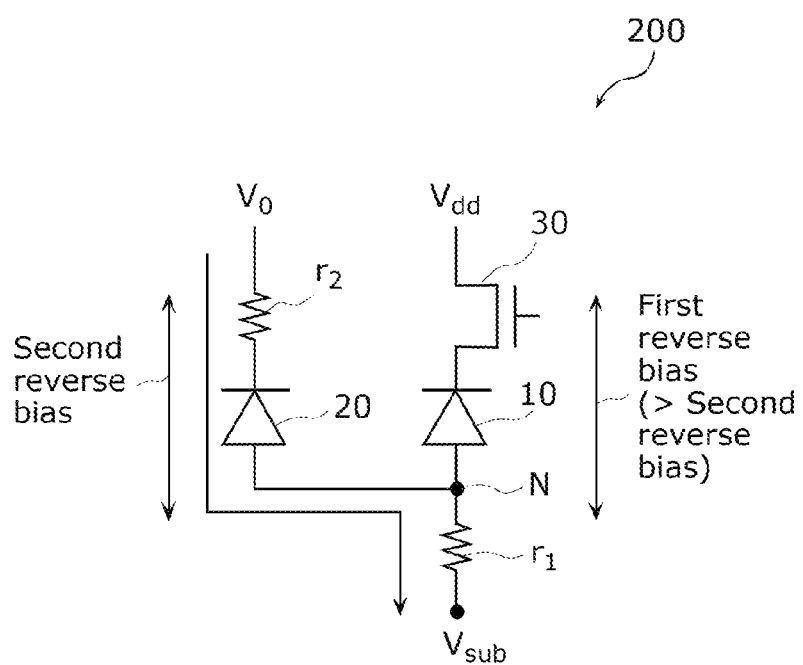
FIG. 19 is a diagram showing a circuit configuration of a photodetector according to Embodiment 2.

In Embodiment 2, a photodetector including a transistor instead of third resistor r3 will be described. FIG. 19 is a diagram showing a circuit configuration of the photodetector according to Embodiment 2.

As shown in FIG. 19, photodetector 200 includes first APD 10, second APD 20, first resistor r1, second resistor r2, and transistor 30. It should be noted that in FIG. 19, the anodes of first APD 10 and second APD 20 are electrically connected to each other, but the cathodes may be electrically connected to each other.

The arrow in FIG. 19 indicates the direction in which a current having a negative polarity flows. In photodetector 200, the absolute value of the first reverse bias applied to first APD 10 is larger than the absolute value of the second reverse bias applied to second APD 20.

Transistor 30 is an N-channel type transistor. Since the resistance value of transistor 30 can be controlled by the gate length and gate width of transistor 30, it can be arbitrarily designed so as to have the resistance value capable of the above-mentioned quenching. In addition, the resistance value may be arbitrarily changed with time by controlling the gate voltage of transistor 30. For example, operations, in which the gate of transistor 30 is turned off at the time of exposure, and the gate of the transistor is turned on at the time of reset, are performed. With this, the resistance value of transistor 30 during the exposure period becomes higher than the resistance value of transistor 30 during the reset period, so that transistor 30 functions as a quenching element, and the multiplication in first APD 10 can be stopped instantly. It should be noted that during the exposure period of first APD 10, the resistance value of transistor 30 becomes higher than the resistance value of first resistor r1.

Although FIG. 19 describes a configuration in which an N-channel transistor is connected to the cathode of the APD, it may be a configuration in which the polarities of the P-type and the N-type are exchanged. In this case, a P-channel transistor is used for the third resistor, but since the P-channel transistor has low mobility, it is easier to realize a higher resistance than the N-channel transistor, and it is easier to realize a high resistance required for third resistor r3. Here, although not shown, first resistor r1 and second resistor r2 may be realized by a transistor.

[Structure of Photodetector]

Figure 20:
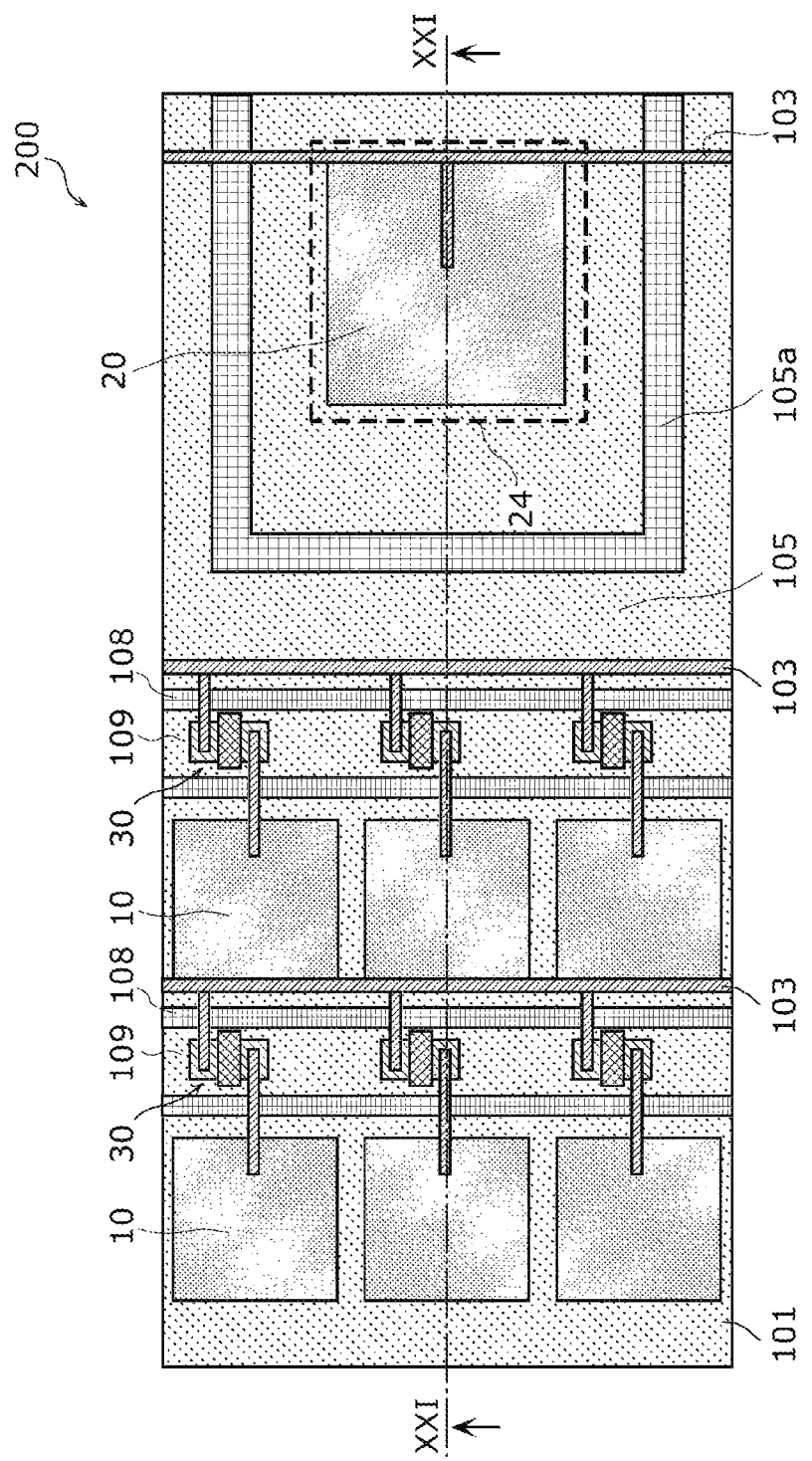
FIG. 20 is a plan view of the photodetector according to Embodiment 2.
Figure 21:
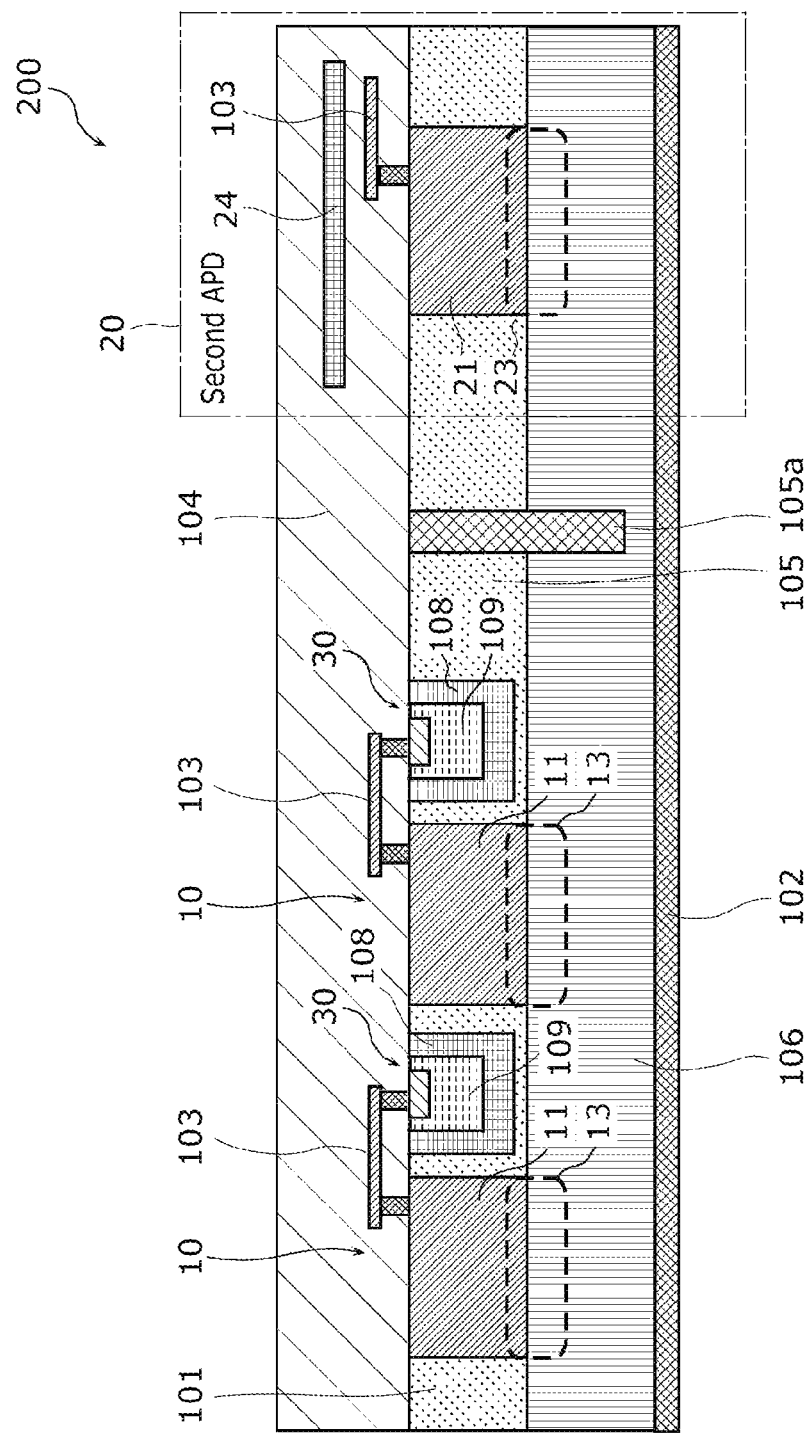
FIG. 21 is a cross-sectional view of the photodetector on the XXI-XXI line in FIG. 20.

Next, the structure of photodetector 200 will be described as an example of the device configuration that realizes the circuit diagram of FIG. 19. FIG. 20 is a plan view of photodetector 200. FIG. 21 is a cross-sectional view of photodetector 200 on the XXI-XXI line in FIG. 20. It should be noted that in FIG. 20, the illustration of insulating layer 104 and the like is omitted.

Photodetector 200 includes semiconductor substrate 101, first semiconductor layer 11, second semiconductor layer 12, light-shielding plate 24, conductor 102, wiring 103, insulating layer 104, separator 105a, second semiconductor layer 106 and transistor 30.

Transistor 30 is formed in the circuit region. The circuit region is, for example, a region including first well 108 having the first conductivity type and second well 109 having the second conductivity type. Transistor 30 is the first conductivity type.

A plurality of first APDs 10 included in photodetector 200 are arranged in a matrix in a plan view, and first APDs 10 belonging to the same column are electrically connected to same wiring 103 via transistors 30. With this, first APDs 10 for reading out signals (in other words, the pixels for reading out signals) can be selected by turning transistors 30 on and off.

[Structure with P-Channel Type Transistor]

Figure 22:
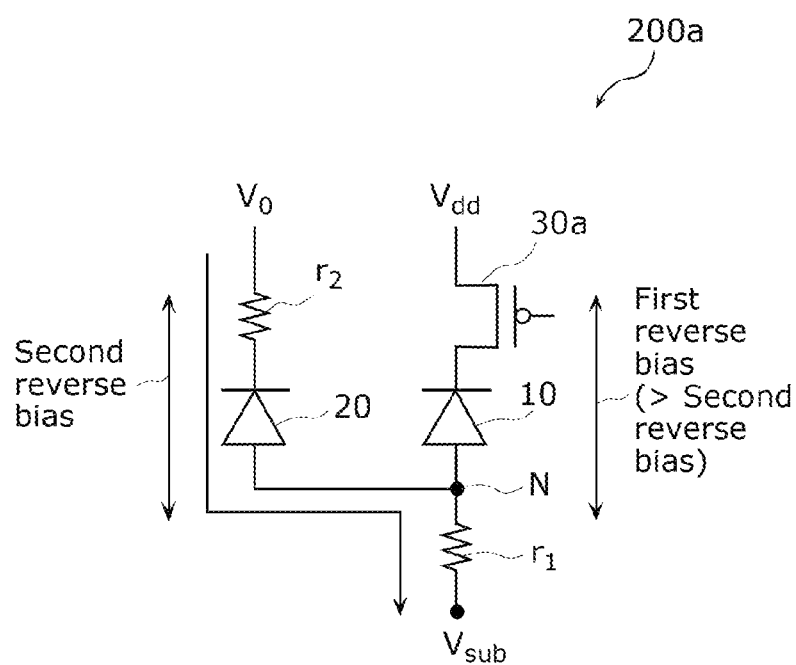
FIG. 22 is a diagram showing a circuit configuration of a photodetector including a P-channel type transistor.

Photodetector 200 may include a P-channel type transistor instead of N-channel type transistor 30. FIG. 22 is a diagram showing a circuit configuration of such a photodetector. It should be noted that in FIG. 22, the anodes of first APD 10 and second APD 20 are electrically connected to each other, but the cathodes may be electrically connected to each other.

In photodetector 200a including such P-channel type transistor 30a, when an electric charge is generated in first APD 10 and the cathode voltage of first APD 10 changes, the resistance of transistor 30a increases, so that the effect that makes quenching more likely to occur is obtained.

Figure 23:
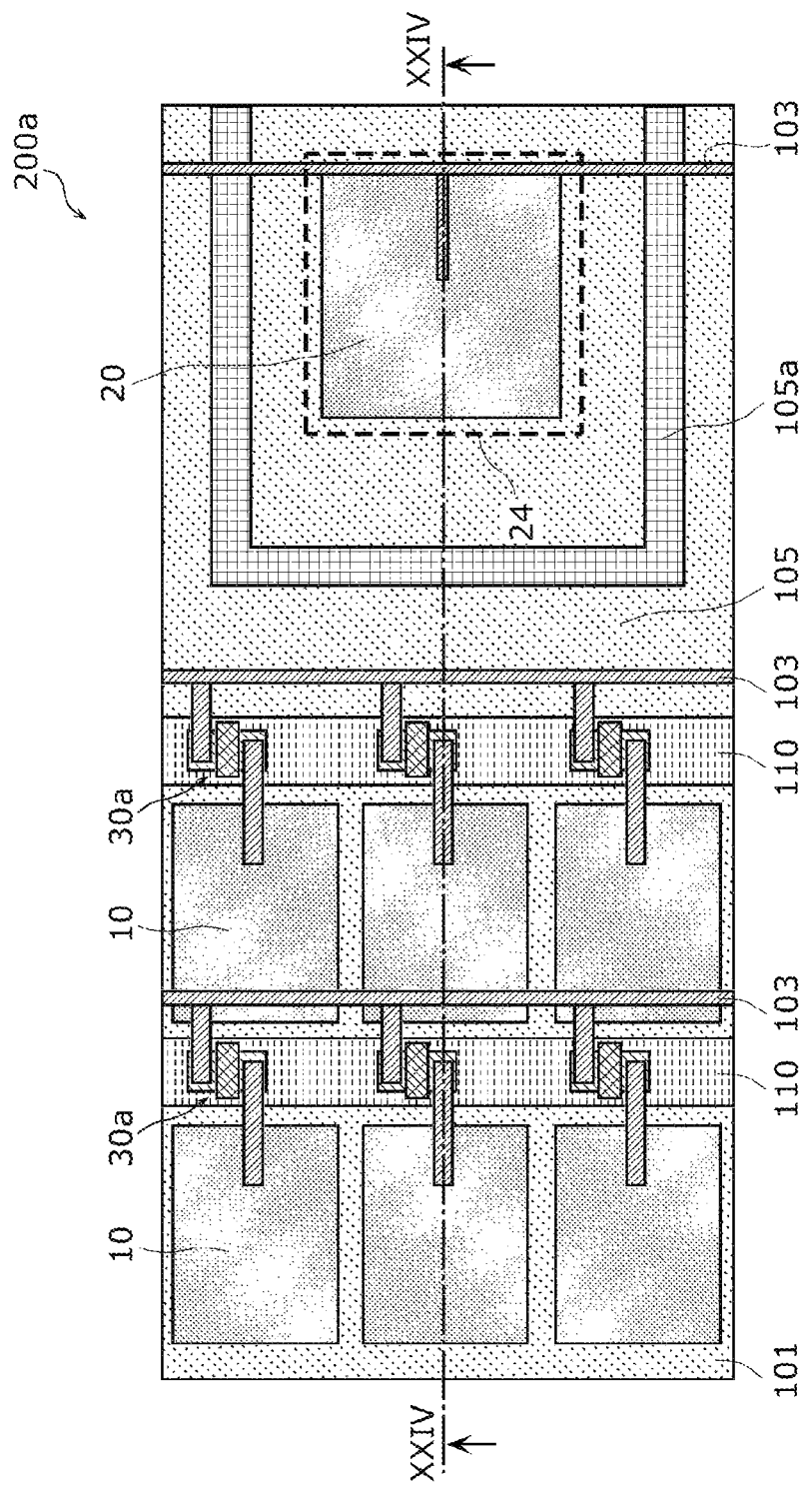
FIG. 23 is a plan view of a photodetector including P-channel type transistors.
Figure 24:
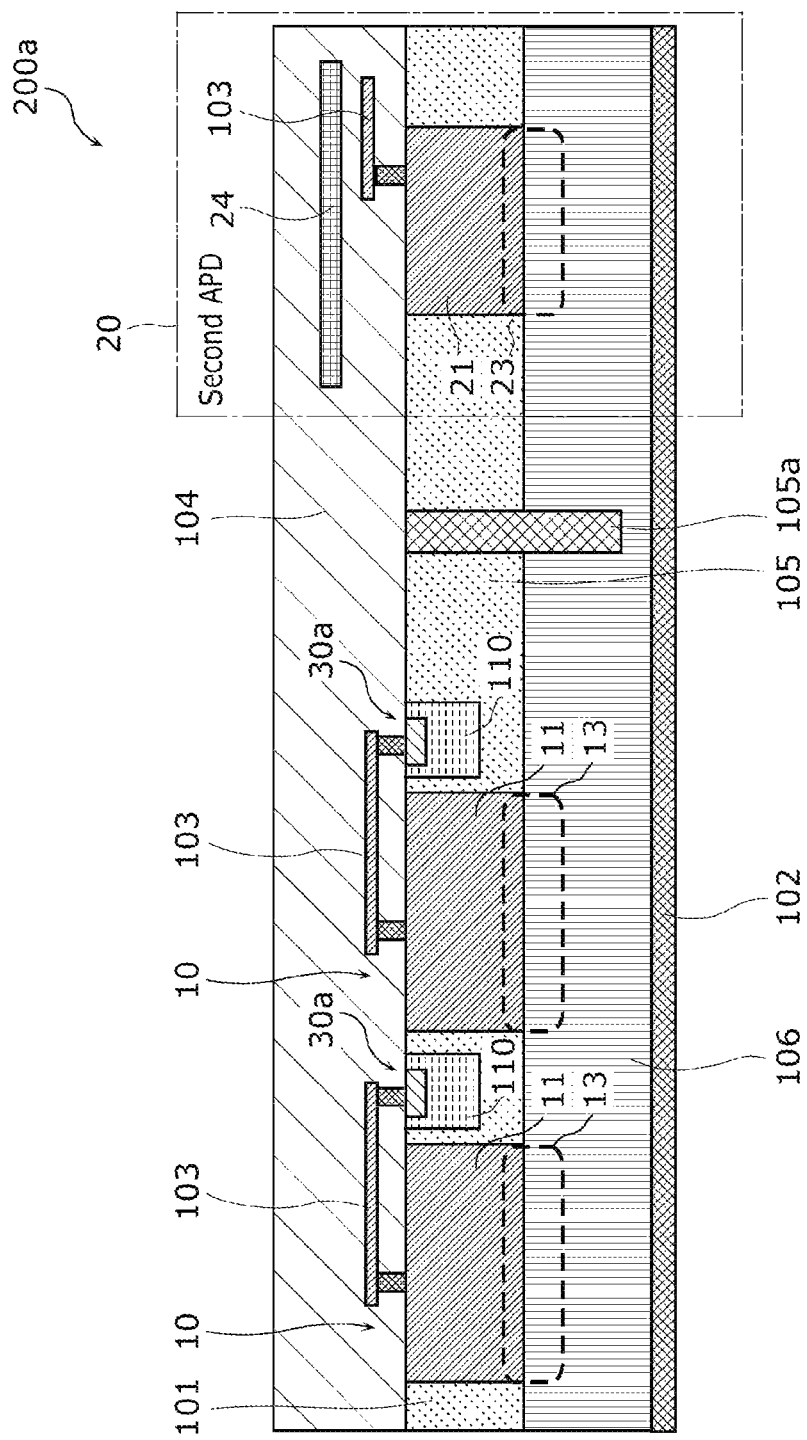
FIG. 24 is a cross-sectional view of the photodetector on the XXIV-XXIV line in FIG. 23.

FIG. 23 is a plan view of photodetector 200a. FIG. 24 is a cross-sectional view of photodetector 200a on the XXIV-XXIV line of FIG. 23. It should be noted that in FIG. 23, the illustration of insulating layer 104 and the like is omitted.

Transistor 30a is formed in the circuit region. The circuit region is a region including well 110 having the first conductivity type. Transistor 30a is the second conductivity type. In this way, photodetector 200a including P-channel type transistor 30a can simplify and make the well structure smaller than photodetector 200 including the N-channel type transistor. Then, the area of first APD 10 can be increased, and the aperture ratio can be improved.

[Variation of the Shape of the Light-Shielding Plate]

Figure 25:
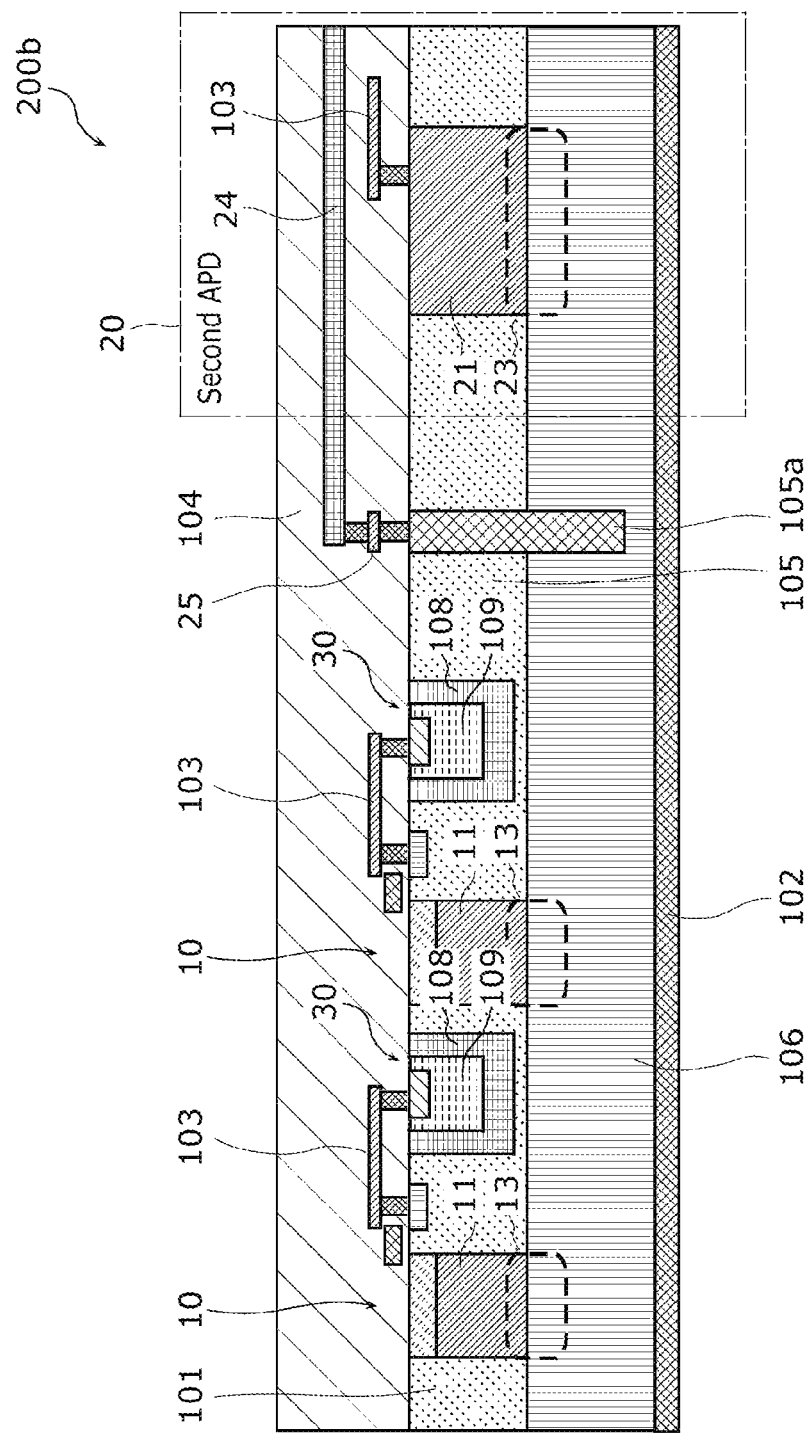
FIG. 25 is a diagram showing a variation of the shape of the light-shielding plate.

A variation of light-shielding plate 24 of the photodetector described above will be described. FIG. 25 is a diagram showing a variation of the shape of the light-shielding plate. Light-shielding plate 24 is preferably formed widely so that second APD 20 is not incident with light, as in photodetector 200b shown in FIG. 25. In particular, it is preferable that light-shielding plate 24 covers up to separator 105a, which is a light-shield portion formed in separator 105. In addition, it is preferable that light-shielding plate 24 is covered with a light-shielding substance so as to surround the outermost periphery of light-shielding plate 24 so that light does not leak into second APD 20 due to oblique light (outer wall 25 of the light-shielding plate). With this, the fluctuation of the current of second APD 20 becomes smaller, the voltage fluctuation of node N is reduced, and the characteristics become more stable. At this time, as shown in FIG. 25, outer wall 25 of the light-shielding plate can be easily formed by forming outer wall 25 of the light-shielding plate with a contact or wiring. In addition, outer wall 25 of the light-shielding plate may be formed of another material without using the wiring layer. As shown in FIG. 25, in order to enhance the light-shielding property, the position of outer wall 25 of the light-shielding plate in the horizontal direction of the substrate preferably coincides with separator 105a which is the light-shield portion, but it does not necessarily have to coincide.

[Example 1 of the Pixel Circuit]

Figure 26:
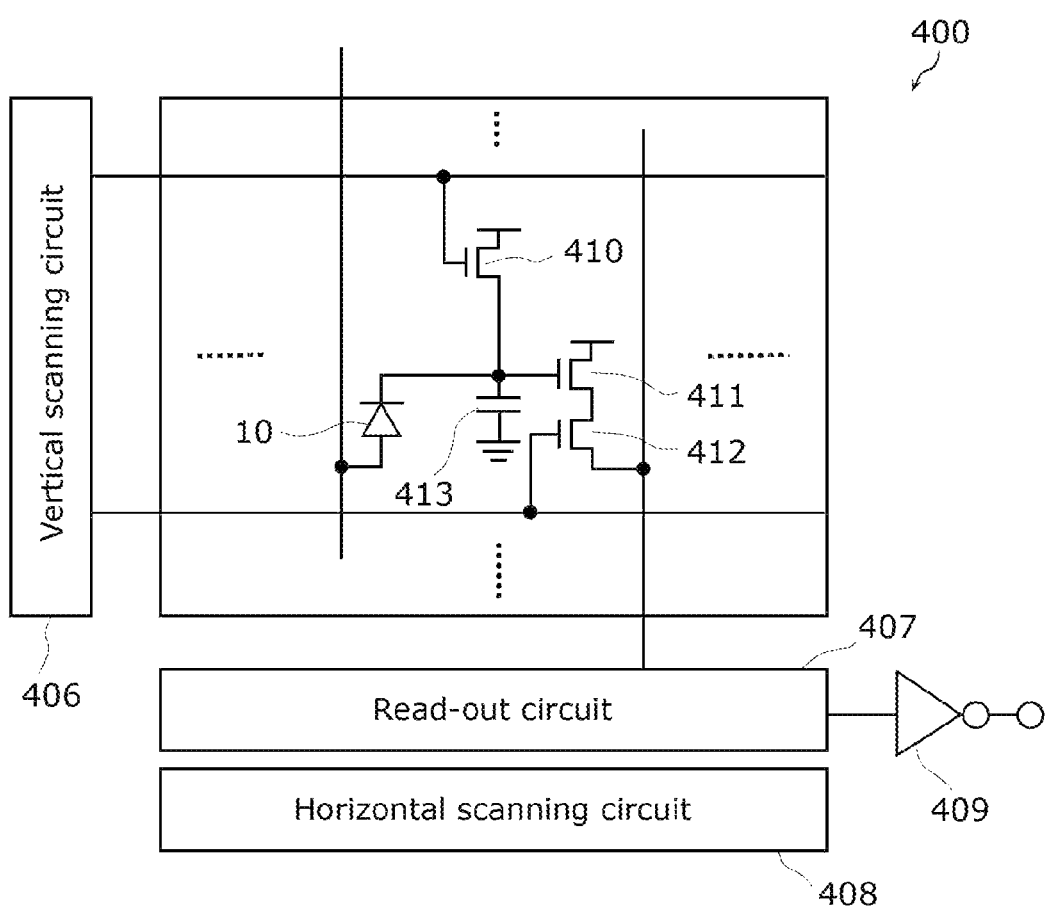
FIG. 26 is a diagram showing an example of a circuit configuration of a pixel circuit.

The pixel circuit of the image pickup device using the above-mentioned photodetector will be described. FIG. 26 is a diagram showing an example of the circuit configuration of the pixel circuit.

Pixel circuit 400 shown in FIG. 26 includes first APD 10, vertical scanning circuit 406, read-out circuit 407, horizontal scanning circuit 408, buffer amplifier 409, reset transistor 410, source follower transistor 411, select transistor 412, and floating diffusion capacity 413.

First, the reset process is performed by reset transistor 410. After that, first APD 10 is selected by vertical scanning circuit 406 and horizontal scanning circuit 408, and the signal charge detected by selected first APD 10 is transferred to floating diffusion capacitance 413. Subsequently, the signal corresponding to the amount of the signal charge is amplified by source follower transistor 411 and transmitted to read-out circuit 407 via select transistor 412. The transmitted signal is output from read-out circuit 407 to the signal processing circuit (not shown) via buffer amplifier 409, and is transferred to display (not shown) or memory (not shown) after the signal processing circuit (not shown) performs signal processing such as white balance. As a result, the signal can be imaged.

Figure 27:
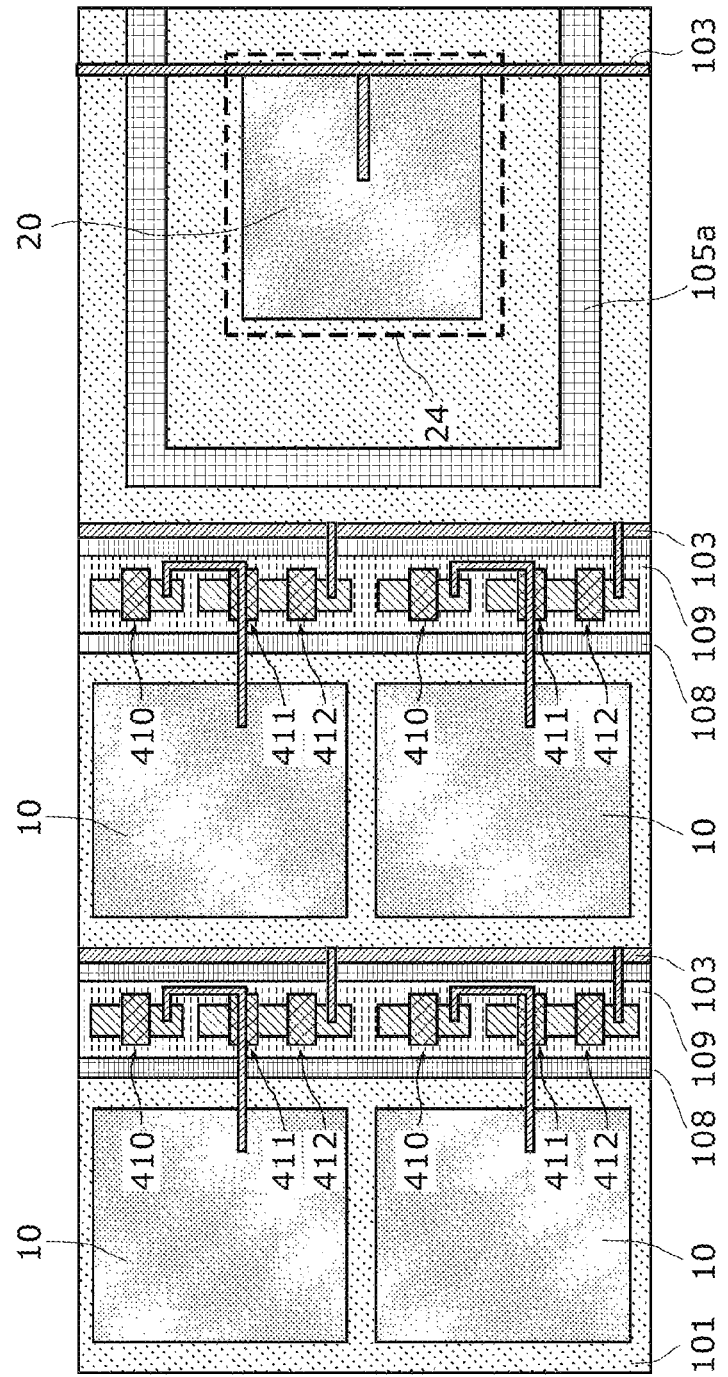
FIG. 27 is a plan view showing an example of arrangement of reset transistors, source follower transistors, and select transistors.

Reset transistor 410, source follower transistor 411, and select transistor 412 included in such pixel circuit 400 are arranged, for example, as shown in FIG. 27. FIG. 27 is a plan view showing an example of the arrangement of reset transistor 410, source follower transistor 411, and select transistor 412.

Figure 28:
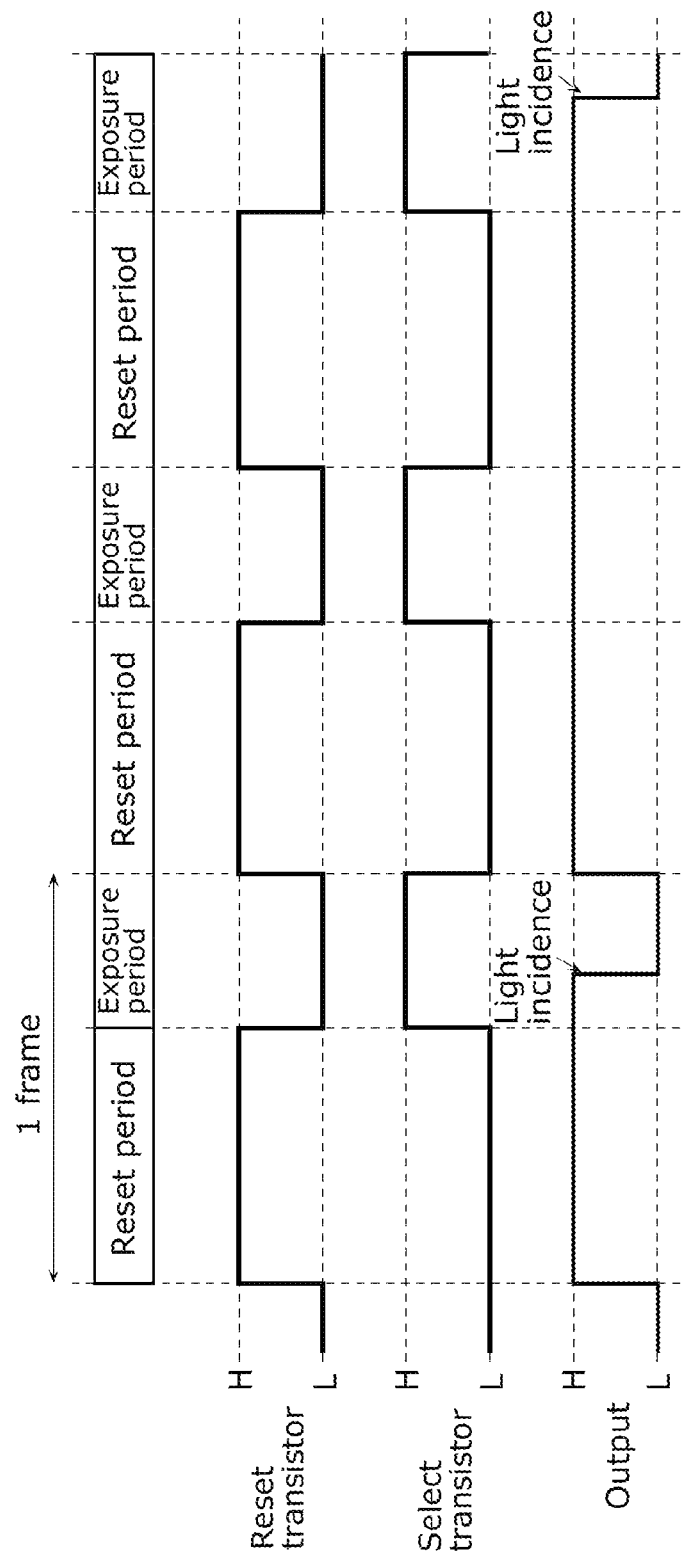
FIG. 28 is a diagram showing a driving example of the pixel circuit of FIG. 26.

FIG. 28 shows a driving example of the circuit illustrated in FIG. 27. The solid line in the figure shows the voltage, 410 and 412 show the gate voltage of reset transistor 410 and the gate voltage of select transistor 412, respectively, and the output shows the output from the vertical signal line. The symbols H and L mean two states, high voltage and low voltage, respectively. Each frame includes a reset period and an exposure period. During the reset period, the gate voltage of reset transistor 410 is set to H, reset transistor 410 is turned on, and a bias is applied to first APD 10. During the exposure period, the gate voltage of reset transistor 410 is set to L, reset transistor 410 is turned off, and the power supply is disconnected from first APD 10. When light is incident during the exposure period, the output voltage fluctuates and light is detected. With this, the output from first APD 10 is amplified by source follower transistor 411, and a large output can be obtained.

Here, reset transistor 410 functions as a third resistor. In the circuit diagram in FIG. 35, reset transistor 410 may be replaced with a resistor.

[Example 2 of the Pixel Circuit]

Figure 29:
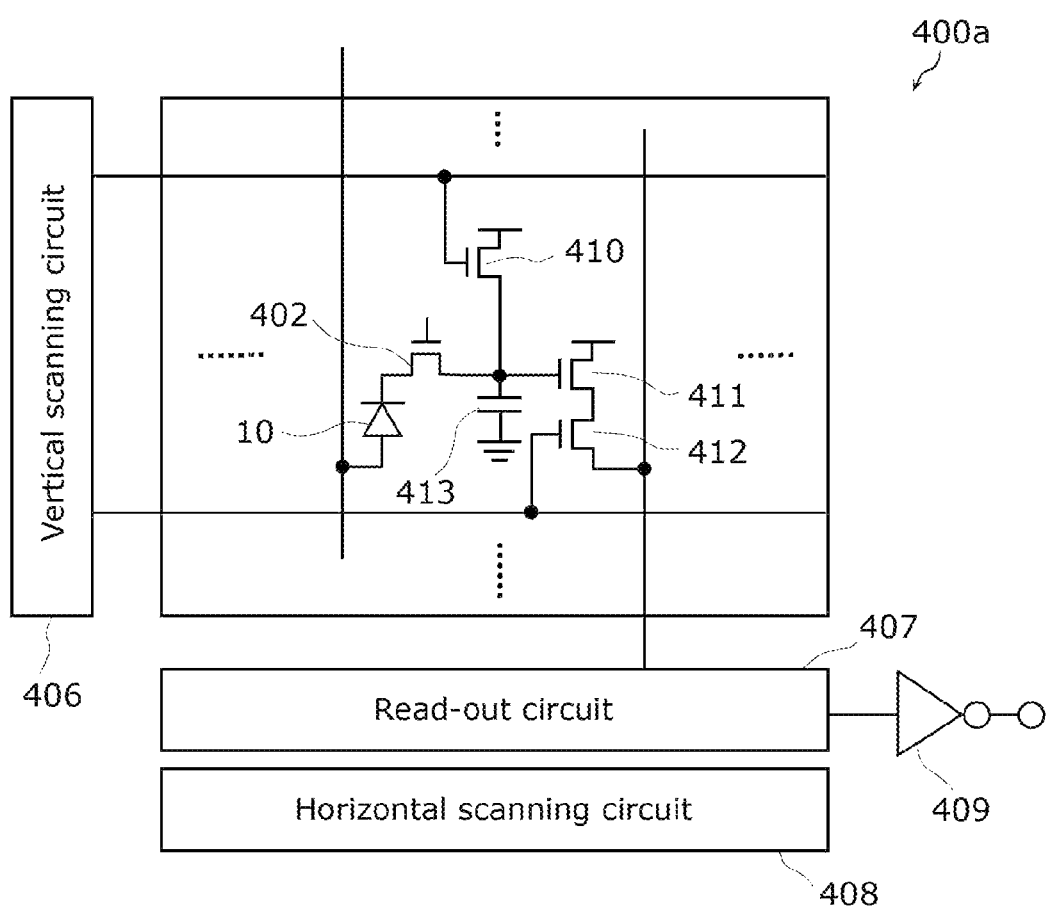
FIG. 29 is a diagram showing another example of the circuit configuration of the pixel circuit.

Another example of the pixel circuit used in the above-mentioned image pickup device will be described. FIG. 29 is a diagram showing another example of the circuit configuration of the pixel circuit.

Pixel circuit 400a shown in FIG. 29 has a circuit configuration in which transfer transistor 402 is added to pixel circuit 400. Transfer transistor 402 transfers the signal charge detected by first APD 10 to floating diffusion capacitance 413.

In addition, the pixel circuit is not limited to the above. For example, a memory or an analog-to-digital conversion circuit may be mounted in the pixel. In addition, a circuit configuration capable of outputting the timing of light detection may be provided.

[Structure in which the Second APDs are Arranged in an Array]

Figure 30:
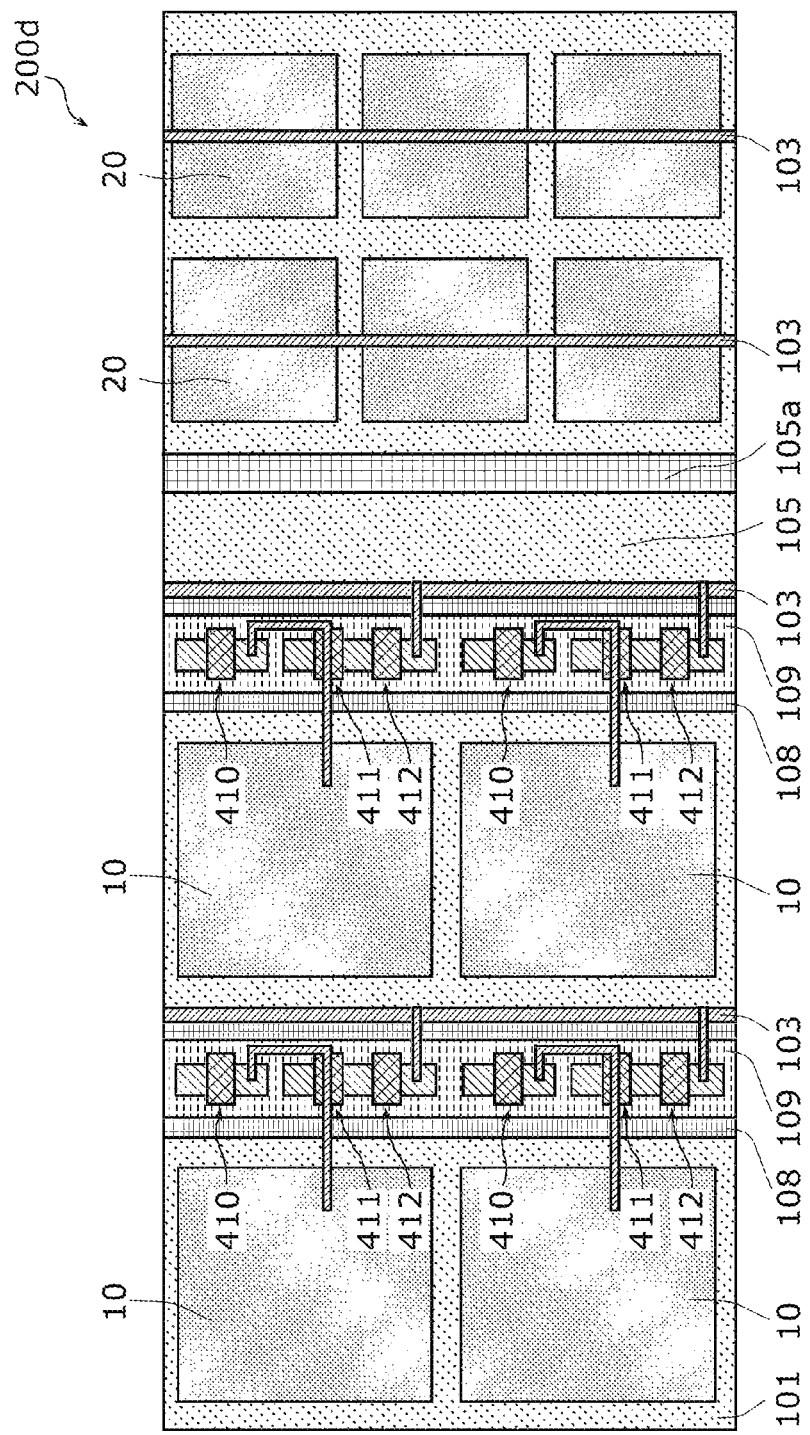
FIG. 30 is a plan view of a photodetector including a plurality of second APDs arranged in an array.

The above-mentioned photodetector may include a plurality of second APDs 20 arranged in an array. FIG. 30 is a plan view of a photodetector including a plurality of second APDs 20 arranged in an array. It should be noted that in FIG. 30, the illustration of insulating layer 104 and the like is omitted.

Photodetector 200d shown in FIG. 30 has a structure in which a plurality of second APDs 20 are arranged in an array. In other points, it has a structure similar to that of photodetector 200.

It is preferable that each of the plurality of second APDs 20 has the same structure as that of first APD 10. When the structure of first APD 10 is different from the structure of second APD 20, there is a concern that the difference between above-mentioned $V_{BD1}(T)$ and $V_{BD2}(T)$ becomes large due to the shape of the end portion of second APD 20 and the like, but by each of the plurality of second APDs 20 having the same structure as that of first APD 10, the difference between $V_{BD1}(T)$ and $V_{BD2}(T)$ can be reduced.

Figure 31:
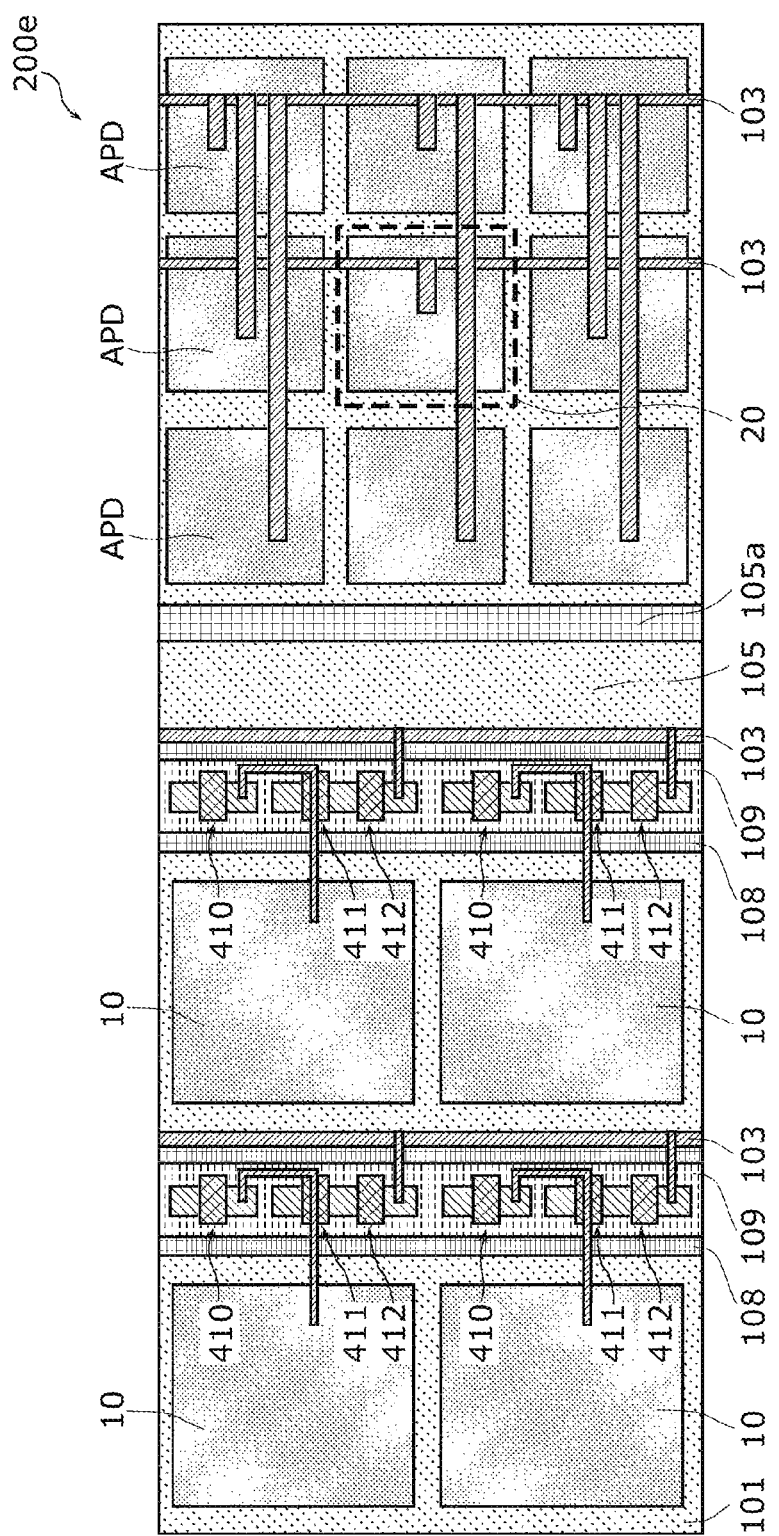
FIG. 31 is a plan view of a photodetector in which only the APD located at the center portion of the plurality of APDs arranged in an array is used as the second APD.

By the way, when a plurality of APDs arranged in an array are formed for use as the second APD, the APDs located at the outermost periphery of these are likely to cause electric field concentration, and a breakdown characteristic different from that of first APD 10 is likely to appear. For example, the APD located at the outermost periphery has a higher breakdown voltage than the APD located at the center portion. Therefore, the APDs located at the outermost periphery of the plurality of APDs arranged in the array may not be used as second APD 20, and only the APD located at the center of the plurality of APDs arranged in the array may be used as second APD 20. FIG. 31 is a plan view of such a photodetector. It should be noted that in FIG. 31, the illustration of insulating layer 104 and the like is omitted.

Photodetector 200e shown in FIG. 31 includes a plurality of APDs arranged in an array in addition to the plurality of first APDs 10 arranged in an array, of which only the APD surrounded by a broken line, which is not on the outermost periphery, is used as second APD 20 and is broken down. Other APDs (APDs on the outermost periphery) are not broken down by applying a reverse bias smaller than that of second APD 20.

In this way, photodetector 200e includes a plurality of APDs arranged in an array at positions different from the plurality of first APDs 10, and second APD 20 is an APD located at a position other than the outermost periphery (for example, the center portion) of the plurality of APDs. In other words, second APD 20 is an APD that is not located on the outermost periphery of the plurality of APDs. According to such a configuration, the difference between above-mentioned $V_{BD1}(T)$ and $V_{BD2}(T)$ can be reduced.

It should be noted that as described above, second APD 20 should have the same structure as first APD 10. Therefore, photodetector 200e may include a plurality of APDs arranged in an array, and first APD 10 may be an APD located at a position (for example, a center portion) other than the outermost periphery of the plurality of APDs. That is, as for first APD 10, an APD that is not located on the outermost periphery may be used.

Embodiment 3

[Arrangement Example 1 of APDs in the Image Pickup Device]

Figure 32:
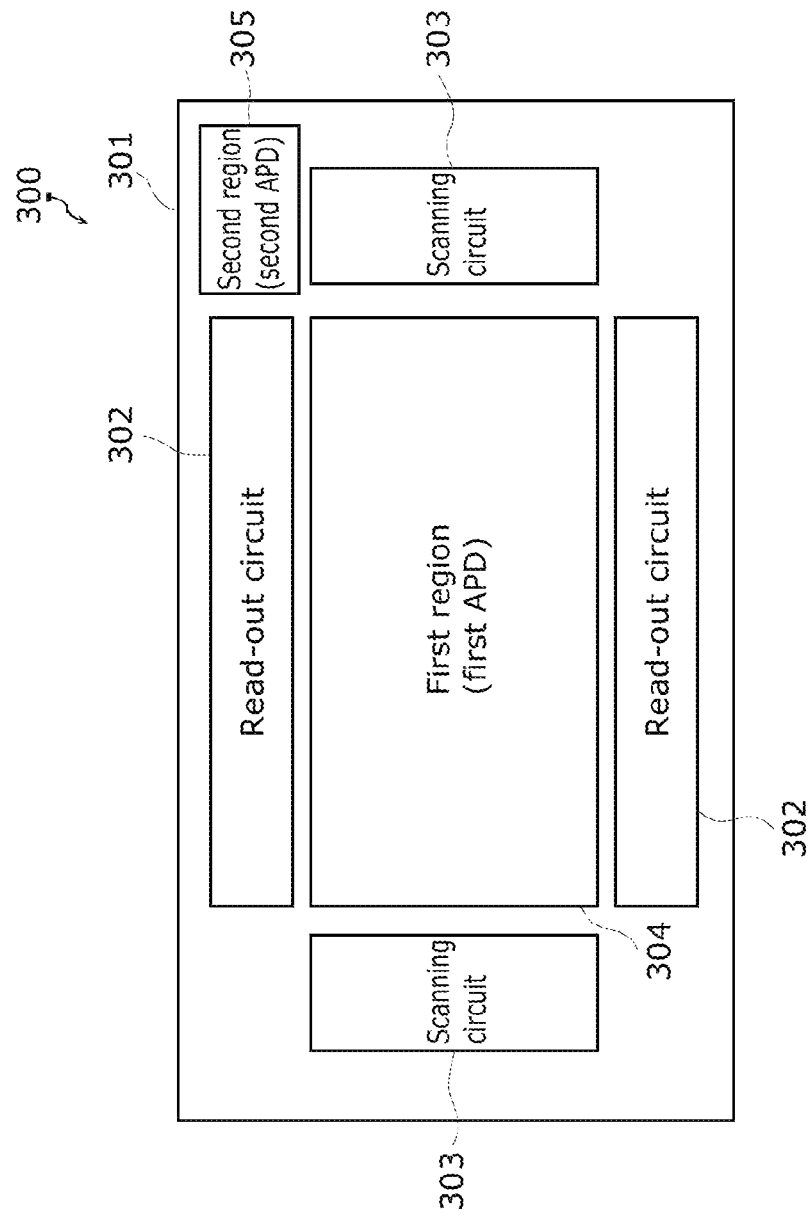
FIG. 32 is a plan view showing arrangement example 1 of the first APD and the second APD in the image pickup device.

In Embodiment 3, the overall arrangement of first APD and second APD 20 when the above-mentioned photodetector is realized as an image pickup device (in other words, an image sensor) will be described. FIG. 32 is a plan view showing arrangement example 1 of first APD 10 and second APD 20 in the image pickup device.

Image pickup device 300 shown in FIG. 32 includes region 301 which is a substrate or a region cut out from the substrate, read-out circuit 302, and scanning circuit 303.

The center portion of the main surface of region 301 is first region 304 in which a plurality of first APDs 10 are arranged, and first region 304 is located between read-out circuits 302 divided into two places and between scanning circuits 303 divided into two places. That is, first region 304 is surrounded by read-out circuit 302 and scanning circuit 303. Here, from the viewpoint of constructing the optical system, first region 304 is preferably arranged at the center of region 301, but does not necessarily have to be at the center.

Second region 305 in which one or more second APDs 20 are arranged is included in the upper right corner portion of the main surface of region 301. At this time, it is preferable that first region 304 and second region 305 are not adjacent to each other. With this, the noise to the first region caused by second region 305 can be reduced. Here, the noise refers to, for example, the electron-hole recombination light and the like, which causes erroneous detection. In addition, the area of first region 304 is preferably larger than the area of second region 305. With this, the area of second APD 20 is reduced without reducing the area of the first region, so that second APD 20 can be arranged in the same chip without reducing the optical sensitivity.

In FIG. 32, second region 305 is arranged only in the upper right region, but it may be arranged in four places at the four corners of the chip. With this, the non-uniformity of the voltage in the chip surface can be reduced, the voltage in the first APD array can be made uniform, and the specific arrangement is not limited.

In this way, in image pickup device 300, first region 304 is provided at the center portion of the main surface of region 301, and second region 305 is provided at the corner portion of the main surface of region 301.

[Arrangement Example 2 of APDs in the Image Pickup Device]

Figure 33:
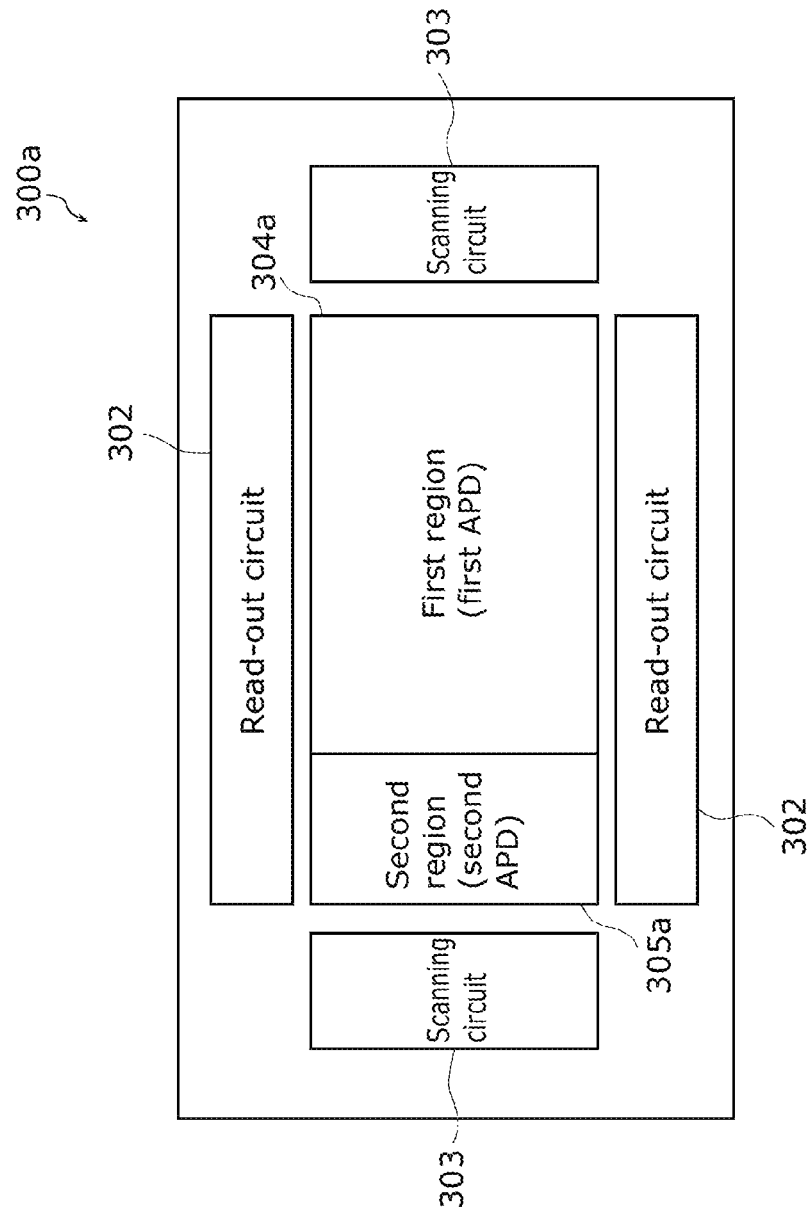
FIG. 33 is a plan view showing arrangement example 2 of the first APD and the second APD in the image pickup device.

FIG. 33 is a plan view showing arrangement example 2 of first APD 10 and second APD 20 in the image pickup device. Image pickup device 300a shown in FIG. 33 includes region 301, read-out circuit 302, and scanning circuit 303.

The center portion of the main surface of region 301 is divided into first region 304a in which a plurality of first APDs 10 are arranged and second region 305a in which one or more second APDs 20 are arranged. First region 304a and second region 305a are located between read-out circuits 302 divided into two places and between scanning circuits 303 divided into two places. That is, first region 304a and second region 305a are surrounded by read-out circuit 302 and scanning circuit 303. The area of first region 304a is preferably larger than the area of second region 305a.

First region 304a and second region 305a are adjacent to each other. It should be noted that the method of adjacency is not particularly limited. First region 304a and second region 305a may be arranged side by side in the horizontal direction as shown in FIG. 33, or may be arranged side by side in the vertical direction although not shown.

When the noise to the first region caused by the second region can be almost ignored, such an arrangement is preferable. By first region 304a and second region 305a adjacent to each other, the regions of first APD 10 and second APD 20 can be reduced, and the chip can be miniaturized.

In this way, in image pickup device 300a, first region 304a and second region 305a are both provided at the center portion of the main surface of region 301, and first region 304a and second region 305a are adjacent to each other.

[Arrangement Example 3 of APDs in the Image Pickup Device]

Figure 34:
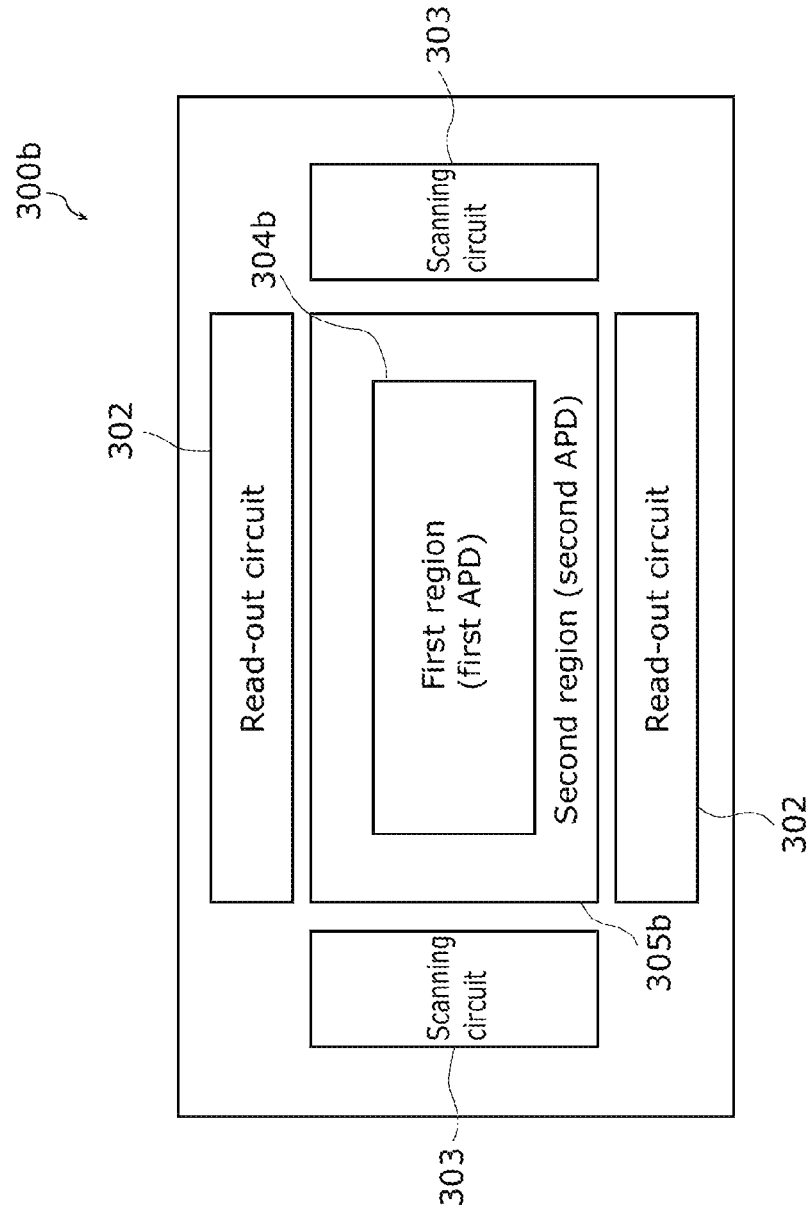
FIG. 34 is a plan view showing arrangement example 3 of the first APD and the second APD in the image pickup device.

FIG. 34 is a plan view showing arrangement example 3 of first APD 10 and second APD 20 in the image pickup device. Image pickup device 300b shown in FIG. 34 includes region 301, read-out circuit 302, and scanning circuit 303.

The plan view shape of region 301 is rectangular. The center portion of the main surface of region 301 is divided into first region 304b in which a plurality of first APDs 10 are arranged and second region 305b in which one or more second APDs 20 are arranged. First region 304b and second region 305b are located between read-out circuits 302 divided into two places and between scanning circuits 303 divided into two places. That is, first region 304b and second region 305b are surrounded by read-out circuits 302 and scanning circuits 303.

First region 304b is a rectangular region, and second region 305b is a rectangular annular region adjacent to first region 304b and surrounding first region 304b. The area of first region 304b is preferably larger than the area of second region 305b. When the noise to the first region caused by the second region is almost negligible, such an arrangement is more preferable. By surrounding first region 304b with second region 305b, the chip can be further miniaturized. In addition, by making the structures of first APD 10 and second APD 20 the same or similar, it is possible to prevent the electric field concentration on the outermost periphery of first APD 10.

In this way, in image pickup device 300b, first region 304b and second region 305b are both provided at the center portion of the main surface of region 301, and second region 305b surrounds first region 304b.

Here, in FIG. 32 to FIG. 34, each region is shown as a rectangle, but the shape is not limited. In addition, they merely show examples of the relationship of the arrangement between first APD 10 and second APD 20, and does not limit the present disclosure.

Embodiment 4

[Structure of the Back-Illuminated Type]

Figure 35:
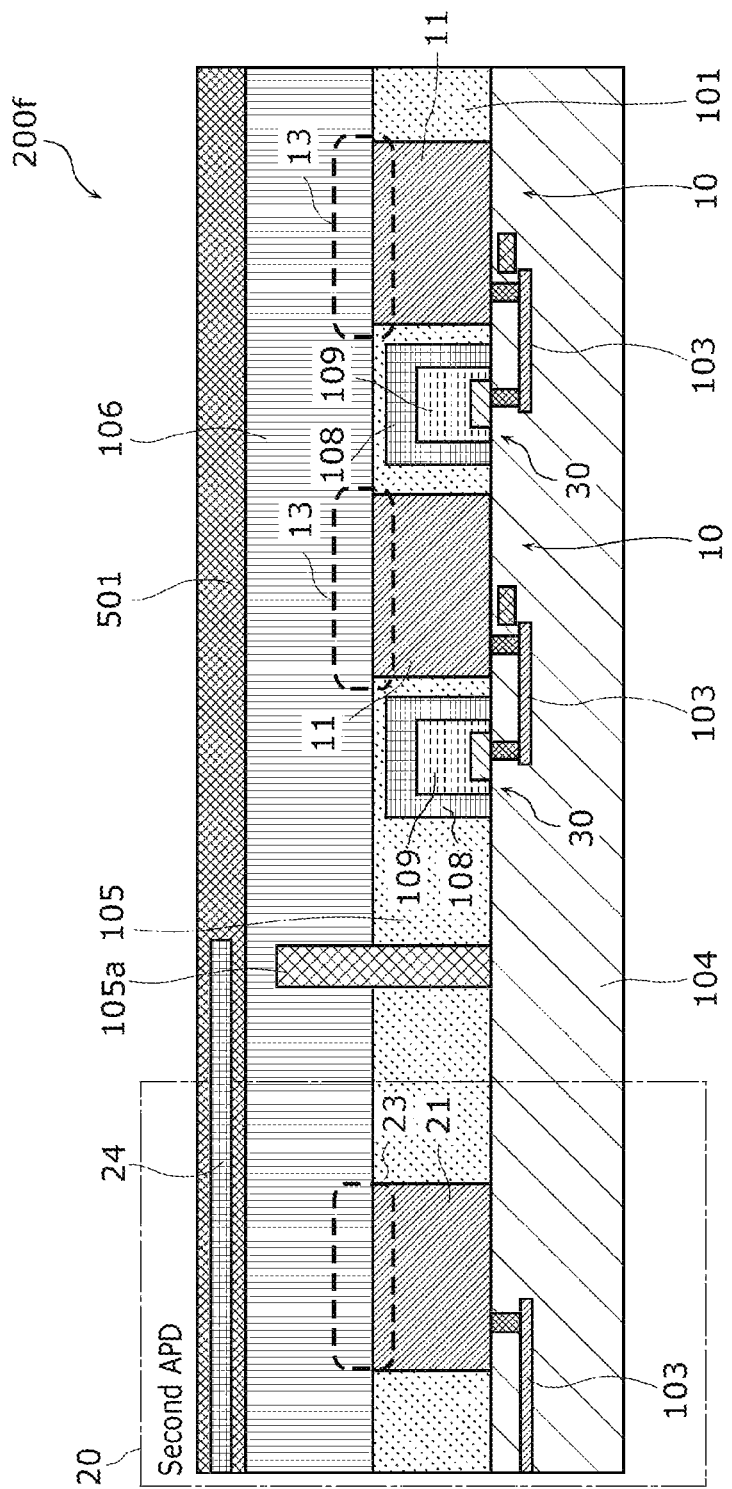
FIG. 35 is an example of a cross-sectional view of a back-illuminated type photodetector.

In Embodiment 4, a case where above-mentioned photodetector 200 is a back-illuminated type will be described. FIG. 35 is an example of a cross-sectional view of a photodetector of the back-illuminated type. Photodetector 200f includes semiconductor substrate 101, first semiconductor layer 11, second semiconductor layer 12, light-shielding plate 24, conductor 102, wiring 103, insulating layer 104, separator 105a, second semiconductor layer 106, transistor 30, and back surface protective layer 501 provided on the back surface of semiconductor substrate 101.

Transistor 30 is formed in the circuit region. The circuit region is, for example, a region including first well 108 having the first conductivity type and second well 109 having the second conductivity type. Transistor 30 is the first conductivity type.

Although not shown, the plurality of first APDs 10 included in photodetector 200 are arranged in a matrix in a plan view, and first APDs 10 belonging to the same column are electrically connected to same wiring 103 via transistors 30. With this, first APDs 10 for reading out the signals (in other words, the pixels for reading out the signals) can be selected by turning transistors 30 on and off.

Light-shielding plate 24 is embedded in back surface protective layer 501 to prevent light irradiation on second APD 20.

By adopting the back-illuminated type, it is possible to reduce the height of the insulating layer on the light incident surface, and the light sensitivity is improved.

Figure 36:
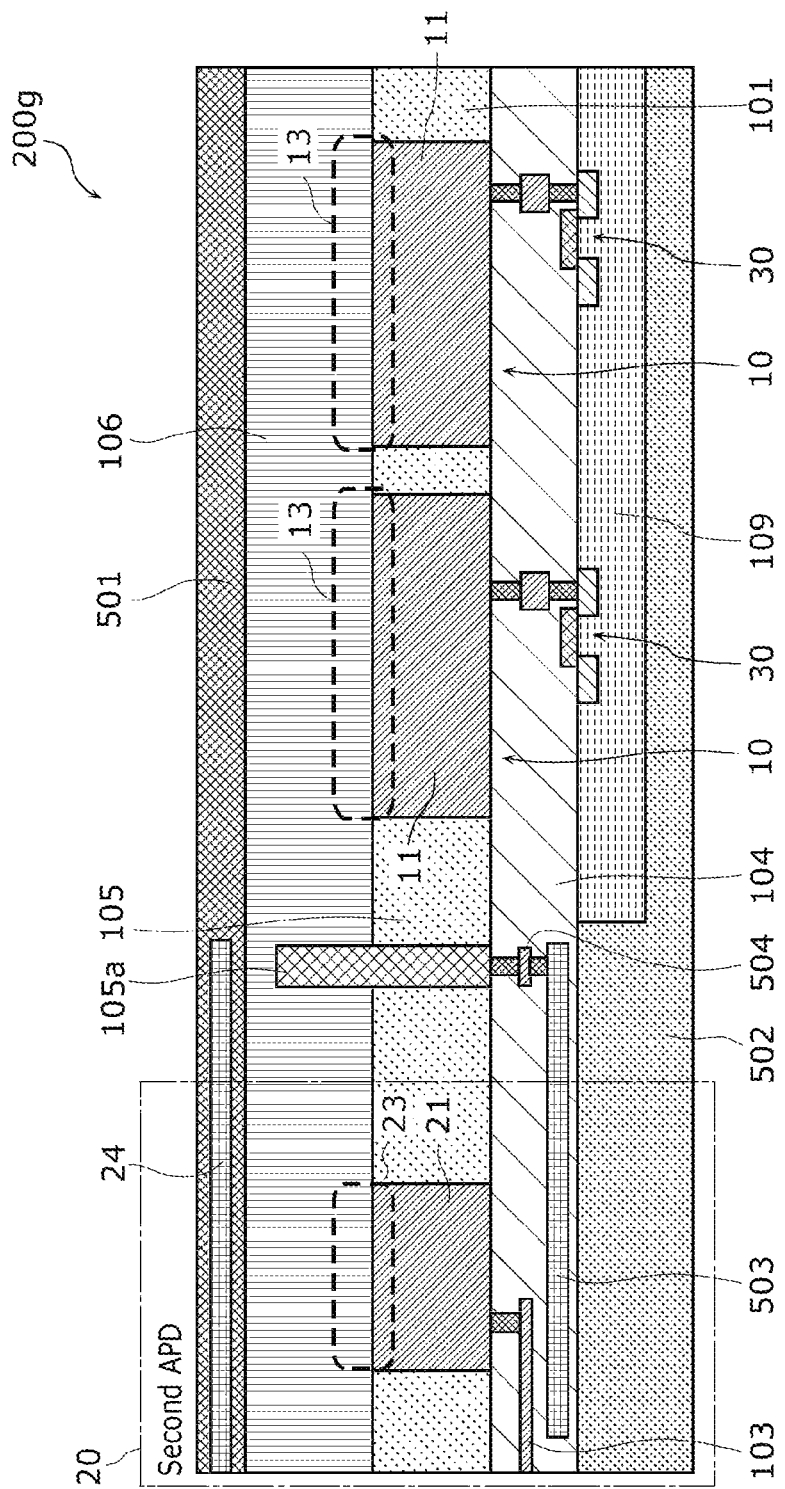
FIG. 36 is an example of a cross-sectional view of a wafer-bonded type photodetector.

In addition, the case where the back-illuminated type is adopted, the circuit region is formed on a separate wafer, and wafer bonding is performed will be described. FIG. 36 is an example of a cross-sectional view of a wafer-bonded type photodetector. Photodetector 200g includes semiconductor substrate 101, first semiconductor layer 11, second semiconductor layer 12, light-shielding plate 24, conductor 102, wiring 103, insulating layer 104, separator 105a, second semiconductor layer 106, transistor 30, back surface protective layer 501 provided on the back surface of semiconductor substrate 101, and second semiconductor substrate 502.

The circuit region is formed on second semiconductor substrate 502. The circuit region is a region including second well 109 having the second conductivity type. Transistor 30 is the first conductivity type. In this case, $V_{sub}$ is applied to the back surface of semiconductor substrate 101 so that first APD 10 and second APD 20 break down, but since the back surface of second semiconductor substrate 502 can be fixed to an arbitrary voltage, first well 108 becomes unnecessary.

With this, the area of first APD 10 is expanded and the aperture ratio is improved, so that the light sensitivity can be increased.

In addition, it is also preferable to form second light-shielding plate 503 on insulating layer 104. With this, it is possible to prevent the light incident on the region of second APD 20 and the light generated by second APD 20 from being reflected at the interface between insulating layer 104 and second semiconductor substrate 502 and leaking to first APD 10.

At this time, as shown in FIG. 36, it is preferable to form the periphery of second light-shielding plate 503 (outer wall 504 of the second light-shielding plate) with a contact or wiring. With this, outer wall 504 of the second light-shielding plate can be formed without any additional steps. Outer wall 504 of the second light-shielding plate may be formed of another material without using the wiring layer. In addition, as shown in FIG. 36, in order to improve the light-shielding property, the position of outer wall 25 of the light-shielding plate in the horizontal direction of the substrate is preferably coincident with separator 105a, but it is not always necessary.

Embodiment 5

[Method for Manufacturing Photodetector]

In Embodiment 5, the method for manufacturing photodetector 200a described above will be described. FIG. 37A to FIG. 37M are cross-sectional views for explaining a method for manufacturing photodetector 200a. It should be noted that other methods for manufacturing photodetectors other than the above-mentioned photodetector 200a can be obtained by appropriately modifying the method for manufacturing photodetector 200a.

Figure 37A:
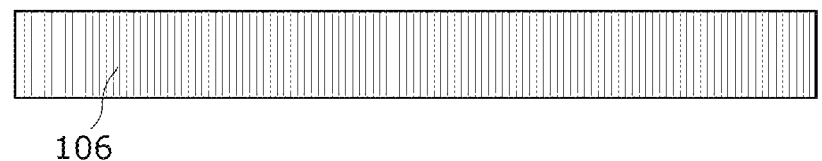
FIG. 37A is a first cross-sectional view for explaining a method of manufacturing a photodetector including a P-channel type transistor.
Figure 37B:
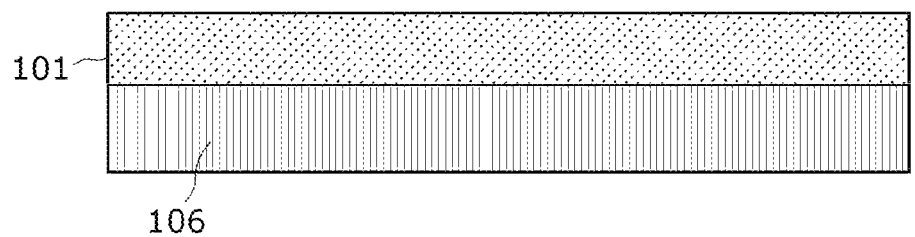
FIG. 37B is a second cross-sectional view for explaining a method of manufacturing a photodetector including a P-channel type transistor.

First, as shown in FIG. 37A and FIG. 37B, second semiconductor layer 106 and semiconductor substrate 101 are formed by epitaxially growing the substrate. The concentration of impurities in second semiconductor layer 106 is higher than the concentration of impurities in semiconductor substrate 101.

Figure 37C:
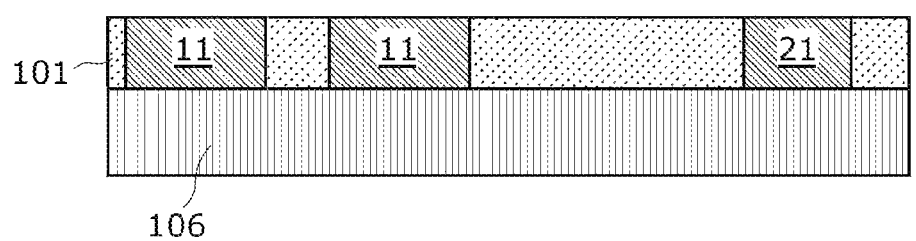
FIG. 37C is a third cross-sectional view for explaining a method of manufacturing a photodetector including a P-channel type transistor.

Next, as shown in FIG. 37C, first semiconductor layer 11 and third semiconductor layer 21 are formed by ion-implanting impurities such as arsenic and phosphorus into semiconductor substrate 101.

Figure 37D:
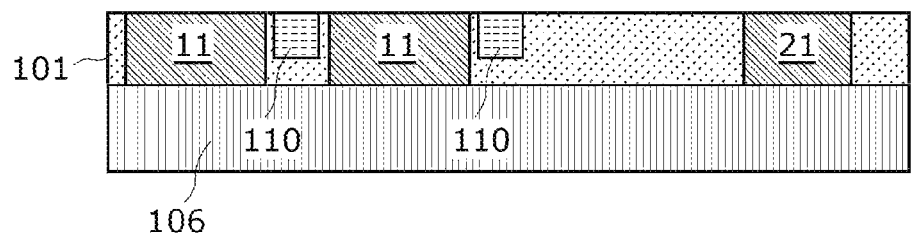
FIG. 37D is a fourth cross-sectional view for explaining a method of manufacturing a photodetector including a P-channel type transistor.

Next, as shown in FIG. 37D, well 110 is formed by ion-implanting impurities such as boron into semiconductor substrate 101.

Figure 37E:
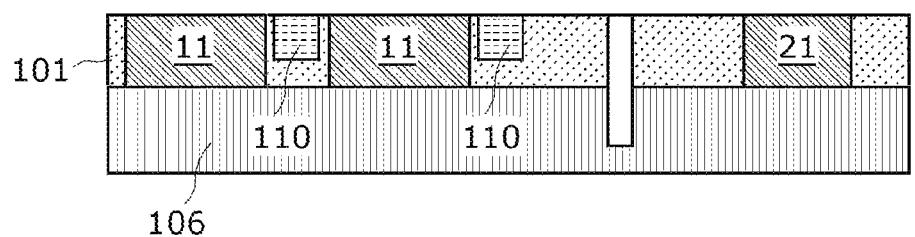
FIG. 37E is a fifth cross-sectional view for explaining a method of manufacturing a photodetector including a P-channel type transistor.
Figure 37F:
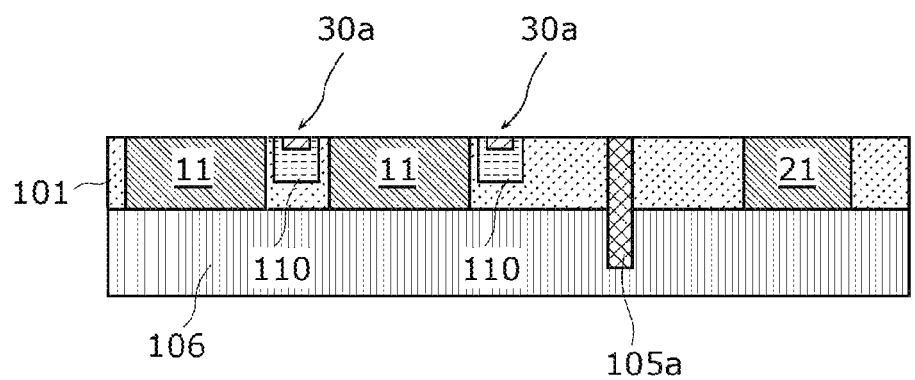
FIG. 37F is a sixth cross-sectional view for explaining a method of manufacturing a photodetector including a P-channel type transistor.

Next, as shown in FIG. 37E, etching for forming separator 105a is performed, and as shown in FIG. 37F, separator 105a is formed by embedding a material having a light transmittance lower than that of semiconductor substrate 101 in a hole (groove) formed by etching. That is, a substance having a light transmittance lower than that of the region of first APD 10 is disposed between first APD 10 and third resistor r3.

Figure 37G:
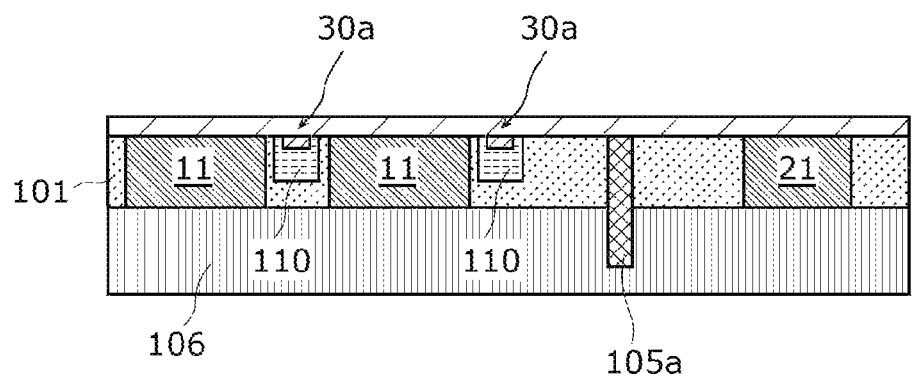
FIG. 37G is a seventh cross-sectional view for explaining a method of manufacturing a photodetector including a P-channel type transistor.
Figure 37H:
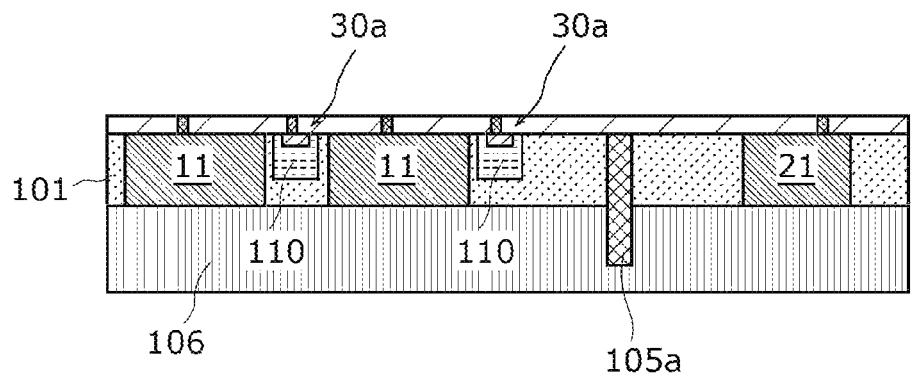
FIG. 37H is an eighth cross-sectional view for explaining a method of manufacturing a photodetector including a P-channel type transistor.

Next, as shown in FIG. 37G, after transistor 30a is formed in well 110, a part of insulating layer 104 is deposited on semiconductor substrate 101 by a chemical vapor deposition (CVD) method. Subsequently, as shown in FIG. 37H, after patterning of the wiring groove (trench) and the via is performed by the lithography method, the trench and the via are formed inside the insulating layer by the dry etching method. Subsequently, by the physical vapor deposition (PVD) method, a barrier film that suppresses the diffusion of Cu and a Cu seed layer for passing an electric current during electrolytic plating are deposited on the inner wall surfaces of the trench and the via. After that, the Cu film is embedded in the trench and the via by the Cu electrolytic plating method.

Figure 37I:
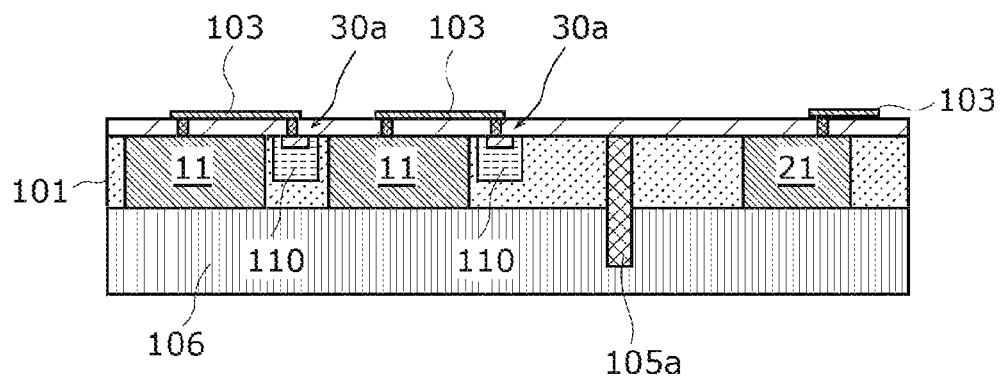
FIG. 37I is a ninth cross-sectional view for explaining a method of manufacturing a photodetector including a P-channel type transistor.

Next, as shown in FIG. 37I, wiring 103 is formed by removing the excess Cu film and the barrier film on the surface by the chemical mechanical polishing (CMP) method.

Figure 37J:
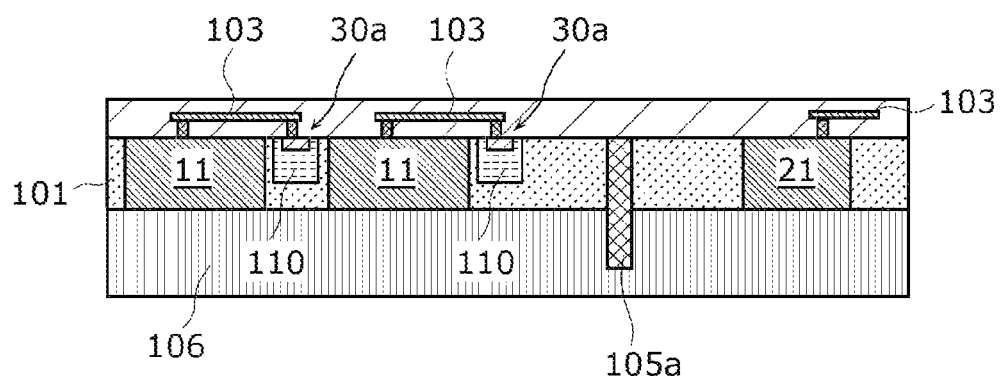
FIG. 37J is a tenth cross-sectional view for explaining a method of manufacturing a photodetector including a P-channel type transistor.
Figure 37K:
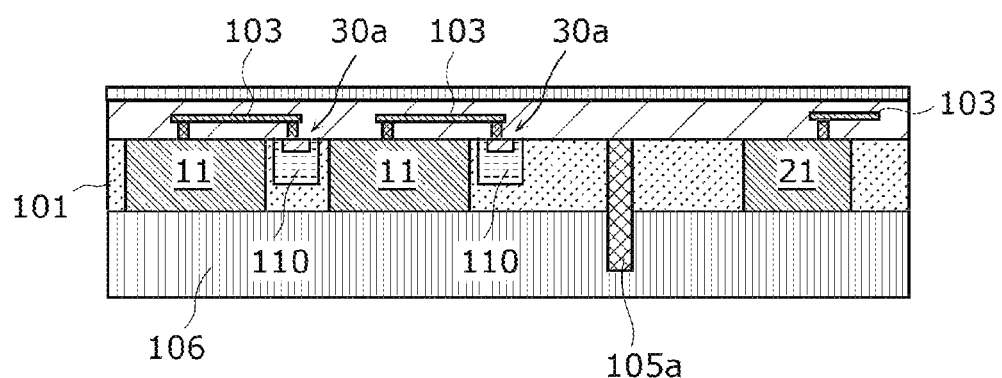
FIG. 37K is an eleventh cross-sectional view for explaining a method of manufacturing a photodetector including a P-channel type transistor.
Figure 37L:
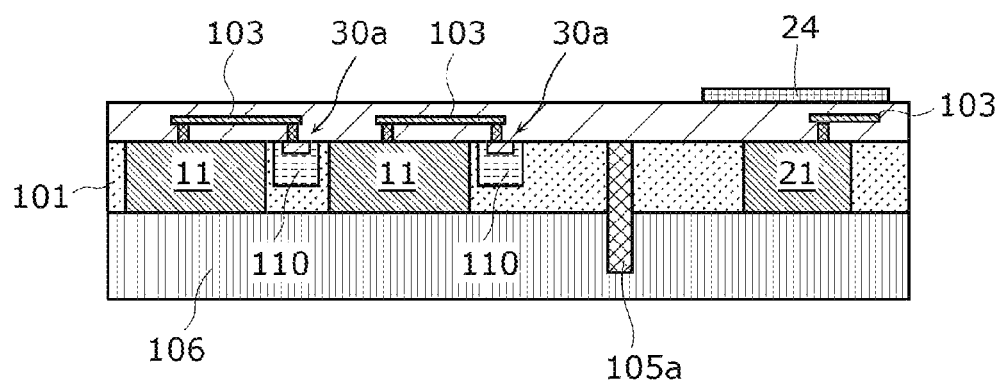
FIG. 37L is a twelfth cross-sectional view for explaining a method of manufacturing a photodetector including a P-channel type transistor.
Figure 37M:
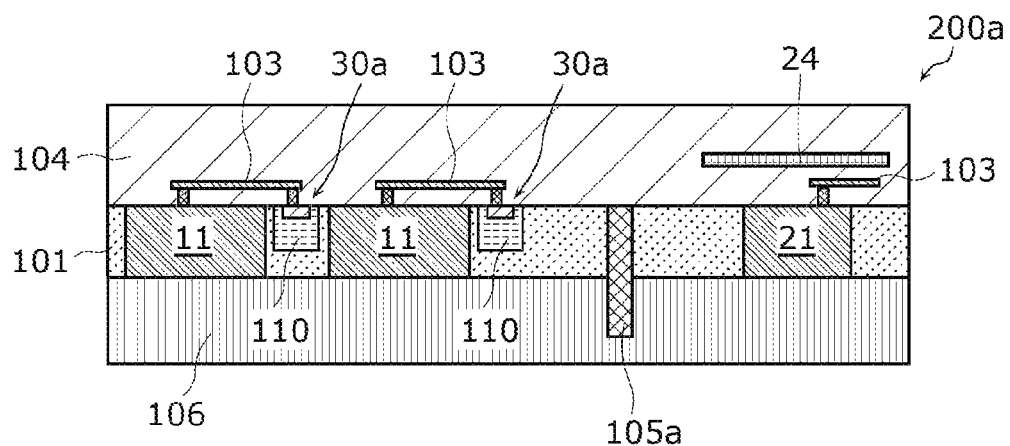
FIG. 37M is a thirteenth cross-sectional view for explaining a method of manufacturing a photodetector including a P-channel type transistor.

Next, as shown in FIG. 37J, a part of the insulating layer is further deposited by chemical vapor deposition, and a light-shielding layer is formed thereon as shown in FIG. 37K. As shown in FIG. 37L, light-shielding plate 24 is formed by etching the light-shielding layer. Finally, as shown in FIG. 37M, a part of the insulating layer is further deposited by chemical vapor deposition to form insulating layer 104.

(Effects, etc.)

As described above, photodetector 100 includes first APD 10 that is sensitive to incident light and second APD 20 having a smaller current value fluctuation width than first APD 10. One terminal of first APD 10 is electrically connected to one terminal of second APD 20, the other terminal of first APD 10 and the other terminal of second APD 20 are connected to different power supplies, and the one terminal of first APD 10 and the one terminal of second APD 20 are both anodes or cathodes.

Such photodetector 100 can reduce the temperature dependence of the characteristics of first APD 10 by a constant current flowing through second APD 20.

In addition, for example, a first reverse bias having an absolute value larger than the first breakdown voltage of first APD 10 is applied to first APD 10, and a second reverse bias having an absolute value larger than the second breakdown voltage of second APD 20 is applied to the second avalanche photodiode.

This makes it easy to use first APD 10 as an APD for light detection and second APD 20 as an APD for temperature feedback for reducing the temperature dependence of the characteristics of first APD 10.

In addition, for example, one terminal of first APD 10 and one terminal of second APD 20 are connected to the first power supply via first resistor r1, and the other terminal of second APD 20 is connected to the second power supply via second resistor r2, the other terminal of first APD 10 is connected to the third power supply via third resistor r3, and the resistance value of the third resistor is higher than both of the resistance value of the first resistor and the resistance value of the second resistor.

This makes it easy to use first APD 10 as an APD for light detection and second APD 20 as an APD for temperature feedback for reducing the temperature dependence of the characteristics of first APD 10.

In addition, for example, third resistor r3 transiently stops the multiplication in first APD 10 by functioning as a quenching element, and first resistor r1 and second resistor r2 do not function as quenching elements and pass a steady current through second APD 20.

Such photodetector 100 can stop the multiplication by third resistor r3.

In addition, for example, the first overvoltage, which is the difference between the absolute value of the first reverse bias and the absolute value of the first breakdown voltage, is larger than the second overvoltage, which is the difference between the absolute value of the second reverse bias and the absolute value of the second breakdown voltage.

In addition, for example, one terminal of first APD 10 and one terminal of second APD 20 are connected to the first power supply via first resistor r1, and the other terminal of second APD 20 is connected to the second power supply via second resistor r2, the other terminal of first APD 10 is connected to the third power supply via transistor 30, and the resistance value of transistor 30 is higher than the resistance value of first resistor r1 during the exposure period of first APD 10.

This makes it easy to use first APD 10 as an APD for light detection and second APD 20 as an APD for temperature feedback for reducing the temperature dependence of the characteristics of first APD 10.

In addition, for example, transistor 30 transiently stops the multiplication in first APD 10 by functioning as a quenching element, and first resistor r1 and second resistor r2 do not function as quenching elements and pass a steady current through second APD 20.

In such photodetector 100, the multiplication can be stopped by transistor 30.

In addition, for example, the resistance value of transistor 30 is controlled by the gate voltage, a reverse bias is applied to first APD 10 during the reset period, and the resistance value of transistor 30 during the exposure period is higher than the resistance value of transistor 30 during the reset period.

Such photodetector 200 can generate quenching due to a voltage drop in transistor 30.

In addition, for example, a substance having a lower light transmittance than the region of first APD 10 is disposed between first APD 10 and third resistor r3.

This facilitates signal detection.

In addition, for example, second APD 20 is shielded from light.

With this, a constant current can flow through second APD 20 regardless of the incident light.

In addition, for example, first APD 10 and second APD 20 are disposed on same semiconductor substrate 101.

With this, first APD 10 and second APD 20 can be produced at the same time by the same process, so that the characteristics of first APD 10 and the characteristics of second APD 20 can be brought close to each other. If the characteristics of first APD 10 and the characteristics of second APD 20 are close to each other, the temperature dependence of the characteristics of the APD can be effectively reduced.

In addition, in photodetector 100, first APD 10 is formed by first semiconductor layer 11 of the first conductivity type and second semiconductor layer 12 of the second conductivity type different from the first conductivity type. Second APD 20 is formed by third semiconductor layer 21 of the first conductivity type and fourth semiconductor layer 22 of the second conductivity type. Photodetector 100 further includes conductor 102 for applying substantially the same potential to second semiconductor layer 12 and fourth semiconductor layer 22.

Such photodetector 100 can apply substantially the same potential to second semiconductor layer 12 and fourth semiconductor layer 22.

In addition, for example, conductor 102 is a semiconductor layer of the second conductivity type.

By using a semiconductor layer of the second conductivity type as conductor 102, such photodetector 100 can apply substantially the same potential to second semiconductor layer 12 and fourth semiconductor layer 22.

In addition, first APD 10 and second APD 20 are optically separated in photodetector 100a.

Such photodetector 100a can suppress the light generated by the recombination of electrons and holes in second APD 20 from entering first APD 10.

In addition, photodetector 100d includes a plurality of first APDs 10 arranged in an array.

Such photodetector 100d can function as an image pickup device that uses first APD 10 as a pixel.

In addition, for example, the photodetector includes a plurality of APDs arranged in an array. First APD 10 is an APD located at a position other than the outermost periphery among the plurality of APDs.

In addition, photodetector 200d includes a plurality of second APDs 20 arranged in an array.

In such photodetector 200d, since the plurality of second APDs 20 have the same structure as the plurality of first APDs 10, the characteristics of first APDs 10 and the characteristics of second APDs 20 can be brought close to each other. When the characteristics of first APDs 10 and the characteristics of second APDs 20 come close to each other, the temperature dependence of the characteristics of first APDs 10 can be effectively reduced.

In addition, photodetector 200e includes a plurality of APDs arranged in an array at positions different from the plurality of first APDs 10. Second APD 20 is an APD located at a position other than the outermost periphery among the plurality of APDs.

In such photodetector 200e, since the APD having a characteristic close to that of first APD 10 among the plurality of APDs is easily used as second APD 20, the temperature dependence of the characteristics of first APD 10 can be effectively reduced.

In addition, among the plurality of APDs, the APD located on the outermost periphery has a higher breakdown voltage than first APD 10 and second APD 20.

In addition, in photodetector 100b, first APD 10 is formed by first semiconductor layer 11 of the first conductivity type and second semiconductor layer 106 of the second conductivity type different from the first conductivity type, and second APD 20 is formed by third semiconductor layer 21 of the first conductivity type and second semiconductor layer 106.

According to such second semiconductor layer 106, it can be suppressed that the difference in the breakdown voltages between first APD 10 and second APD 20 occurs, and it is possible to effectively reduce the temperature dependence of the characteristics of first APD 10.

In addition, second semiconductor layer 106 is formed by epitaxial growth.

In this way, second semiconductor layer 106 can be easily formed by epitaxial growth.

n addition, in photodetector 100, the area of first APD 10 is larger than the area of second APD 20 in a plan view.

This improves the photosensitivity or aperture ratio of photodetector 100.

Other Embodiments

Although the photodetectors according to the embodiments have been described above, the present disclosure is not limited to the above embodiments.

For example, all the numbers used in the description in the above embodiments are exemplified for concretely explaining the present disclosure, and the present disclosure is not limited to the exemplified numbers.

In addition, in the above embodiments, the main materials included in each layer of the laminated structure included in the photodetector are exemplified, but other materials may be included in each layer of the laminated structure included in the photodetector as long as the same functions as the laminated structure of the above embodiments can be realized. In addition, in the drawings, the corners and sides of each component are shown linearly, but the present disclosure also includes those having rounded corners and sides due to manufacturing reasons and the like.

In addition, forms obtained by applying various modifications to each embodiment conceived by a person skilled in the art or forms realized by arbitrarily combining the components and functions in each embodiment without departing from the spirit of the present disclosure are also included in this disclosure. For example, the present disclosure may be realized as a method for manufacturing a photodetector.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The photodetector of the present disclosure is useful as a photodetector with reduced temperature dependence.

The invention claimed is:

1. A photodetector, comprising:
a first avalanche photodiode that is sensitive to incident light; and
a second avalanche photodiode through which a current flows, the current having a smaller current value fluctuation width than a current flowing through the first avalanche photodiode,
wherein one terminal of the first avalanche photodiode is electrically connected to one terminal of the second avalanche photodiode,
an other terminal of the first avalanche photodiode and an other terminal of the second avalanche photodiode are connected to different power supplies,
the one terminal of the first avalanche photodiode and the one terminal of the second avalanche photodiode are both anodes or cathodes,
the one terminal of the first avalanche photodiode and the one terminal of the second avalanche photodiode are connected to a first power supply via a first resistor,
the other terminal of the second avalanche photodiode is connected to a second power supply via a second resistor,
the other terminal of the first avalanche photodiode is connected to a third power supply via a third resistor, and
the third resistor has a resistance value higher than both of a resistance value of the first resistor and a resistance value of the second resistor.

2. The photodetector according to claim 1,
wherein a first reverse bias having an absolute value larger than an absolute value of a first breakdown voltage of the first avalanche photodiode is applied to the first avalanche photodiode, and
a second reverse bias having an absolute value larger than an absolute value of a second breakdown voltage of the second avalanche photodiode is applied to the second avalanche photodiode.

3. The photodetector according to claim 1,
wherein the third resistor transiently stops multiplication in the first avalanche photodiode by functioning as a quenching element, and
the first resistor and the second resistor do not function as quenching elements, and pass a steady current through the second avalanche photodiode.

4. The photodetector according to claim 3,
wherein a first overvoltage is larger than a second overvoltage, the first overvoltage being a difference between the absolute value of the first reverse bias and the absolute value of the first breakdown voltage, the second overvoltage being a difference between the absolute value of the second reverse bias and the absolute value of the second breakdown voltage.

5. The photodetector according to claim 1,
wherein the second avalanche photodiode is shielded from light.

6. The photodetector according to claim 1,
wherein the first avalanche photodiode and the second avalanche photodiode are disposed on a same semiconductor substrate.

7. The photodetector according to claim 1,
wherein the first avalanche photodiode includes:
a first semiconductor layer of a first conductivity type; and
a second semiconductor layer of a second conductivity type different from the first conductivity type,
the second avalanche photodiode includes:
a third semiconductor layer of the first conductivity type; and
a fourth semiconductor layer of the second conductivity type, and
the photodetector further includes a conductor for applying substantially a same potential to the second semiconductor layer and the fourth semiconductor layer.

8. The photodetector according to claim 7,
wherein the conductor is a semiconductor layer of the second conductivity type.

9. The photodetector according to claim 1,
wherein a substance having a lower light transmittance than a light transmittance in a region of the first avalanche photodiode is disposed between the first avalanche photodiode and the second avalanche photodiode.

10. The photodetector according to claim 1,
wherein the photodetector includes a plurality of first avalanche photodiodes arranged in an array, each of the plurality of first avalanche photodiodes being the first avalanche photodiode.

11. The photodetector according to claim 1,
wherein the photodetector includes a plurality of avalanche photodiodes arranged in an array, and
the first avalanche photodiode among the plurality of avalanche photodiodes is an avalanche photodiode located at a position other than an outermost periphery.

12. The photodetector according to claim 1,
wherein the photodetector includes a plurality of second avalanche photodiodes arranged in an array, each of the plurality of second avalanche photodiodes being the second avalanche photodiode.

13. The photodetector according to claim 12,
wherein the photodetector includes a plurality of avalanche photodiodes arranged in an array at a position different from a position of the first avalanche photodiode, and
the second avalanche photodiode is an avalanche photodiode located at a position other than an outermost periphery among the plurality of avalanche photodiodes.

14. The photodetector according to claim 1,
wherein the first avalanche photodiode includes:
a first semiconductor layer of a first conductivity type; and
a second semiconductor layer of a second conductivity type different from the first conductivity type, and
the second avalanche photodiode includes:
a third semiconductor layer of the first conductivity type; and
a fourth semiconductor layer of the second conductivity type.

15. The photodetector according to claim 14,
wherein the second semiconductor layer is formed by epitaxial growth.

16. The photodetector according to claim 1,
wherein in a plan view, the first avalanche photodiode has an area larger than an area of the second avalanche photodiode.

17. A photodetector, comprising:
a first avalanche photodiode that is sensitive to incident light; and
a second avalanche photodiode through which a current flows, the current having a smaller current value fluctuation width than a current flowing through the first avalanche photodiode,
wherein one terminal of the first avalanche photodiode is electrically connected to one terminal of the second avalanche photodiode,
an other terminal of the first avalanche photodiode and an other terminal of the second avalanche photodiode are connected to different power supplies,
the one terminal of the first avalanche photodiode and the one terminal of the second avalanche photodiode are both anodes or cathodes,
the one terminal of the first avalanche photodiode and the one terminal of the second avalanche photodiode are connected to a first power supply via a first resistor,
the other terminal of the second avalanche photodiode is connected to a second power supply via a second resistor,
the other terminal of the first avalanche photodiode is connected to a third power supply via a transistor, and
during an exposure period of the first avalanche photodiode, the transistor has a resistance value higher than a resistance value of the first resistance.

18. The photodetector according to claim 17,
wherein the transistor transiently stops multiplication in the first avalanche photodiode by functioning as a quenching element, and
the first resistor and the second resistor do not function as quenching elements, and pass a steady current through the second avalanche photodiode.

19. The photodetector according to claim 17,
wherein the resistance value of the transistor is controlled by a gate voltage, and
the resistance value of the transistor during the exposure period is higher than the resistance value of the transistor during a reset period.

20. A photodetector, comprising:
a first avalanche photodiode that is sensitive to incident light; and
a second avalanche photodiode through which a current flows, the current having a smaller current value fluctuation width than a current flowing through the first avalanche photodiode,
wherein one terminal of the first avalanche photodiode is electrically connected to one terminal of the second avalanche photodiode,
an other terminal of the first avalanche photodiode and an other terminal of the second avalanche photodiode are connected to different power supplies,
the one terminal of the first avalanche photodiode and the one terminal of the second avalanche photodiode are both anodes or cathodes,
the photodetector includes a plurality of avalanche photodiodes arranged in an array, and
the first avalanche photodiode among the plurality of avalanche photodiodes is an avalanche photodiode located at a position other than an outermost periphery
the photodetector includes a plurality of second avalanche photodiodes arranged in an array, each of the plurality of second avalanche photodiodes being the second avalanche photodiode, and
wherein among the plurality of avalanche photodiodes, an avalanche photodiode located on the outermost periphery has a higher breakdown voltage than the first avalanche photodiode and the second avalanche photodiode.

* * * * *